(12) United States Patent
Lu

(10) Patent No.: US 7,945,887 B2
(45) Date of Patent: May 17, 2011

(54) MODELING SPATIAL CORRELATIONS

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 730 days.

(21) Appl. No.: 12/028,854

(22) Filed: Feb. 11, 2008

(65) Prior Publication Data

US 2009/0204365 A1 Aug. 13, 2009

(51) Int. Cl.
*G06F 17/50* (2006.01)
(52) U.S. Cl. .................. 716/136; 716/110; 702/179
(58) Field of Classification Search .......... 716/110, 716/136; 702/179
See application file for complete search history.

(56) References Cited

U.S. PATENT DOCUMENTS

| | | | |
|---|---|---|---|
| 6,378,109 B1 * | 4/2002 | Young et al. | 716/115 |
| 6,668,080 B1 * | 12/2003 | Torr et al. | 382/173 |
| 6,865,582 B2 * | 3/2005 | Obradovic et al. | 1/1 |
| 7,212,946 B1 | 5/2007 | Venkateswaran et al. | |
| 7,487,486 B2 * | 2/2009 | Celik et al. | 716/134 |
| 7,533,140 B2 * | 5/2009 | Jaber | 708/322 |
| 7,561,188 B2 * | 7/2009 | Kondo et al. | 348/222.1 |
| 7,653,160 B2 * | 1/2010 | Piirainen | 375/346 |
| 7,689,954 B2 * | 3/2010 | Zhang et al. | 716/113 |
| 2005/0127908 A1 * | 6/2005 | Schlicker et al. | 324/240 |
| 2007/0118331 A1 * | 5/2007 | Venkateswaran et al. | 702/179 |
| 2008/0005707 A1 * | 1/2008 | Papanikolaou et al. | 716/4 |
| 2009/0228250 A1 * | 9/2009 | Phillips | 703/2 |
| 2009/0267603 A1 * | 10/2009 | Yanasak | 324/309 |
| 2010/0061438 A1 * | 3/2010 | Tan et al. | 375/227 |

OTHER PUBLICATIONS

Bhardwaj et al., "Modeling of Intra-die Process Variations for Accurate Analysis and Optimization of Nano-scale Circuits," Design Automative Conference, Jul. 24-28, 2006, pp. 791-796.
Zhang et al., "Efficient Modeling of Spatial Correlations in Parameterized Statistical Timing," IBM Design Automation Workshop, East Fishkill, New York, Mar. 2006, 8 pages.
Chang et al., "Statistical Timing Analysis Under Spatial Correlations," IEEE Transactions on Computer-Aided Design of Integrated Circuits and Systems, vol. 24, No. 9, Sep. 2005, pp. 1467-1482.
Doh et al., "A Unified Statistical Model for Inter-Die and Intra-Die Process Variation," Simulation of Semiconductor Processes and Devices, Sep. 2005, pp. 131-134.
Mangassarian et al., "On Statistical Timing Analysis with Inter- and Intra-die Variations," Proceedings of the Design, Automation, and Test in Europe Conference and Exhibition, 2005, pp. 1530-1591.
Agarwal et al., "Statistical Delay Computation Considering Spatial Correlations," Asia-Pacific Design Automation Conference, Jan. 2003, pp. 271-276.

* cited by examiner

*Primary Examiner* — Naum Levin
(74) *Attorney, Agent, or Firm* — Richard M. Kotulak; Hoffman Warnick LLC

(57) ABSTRACT

Modeling spatial correlations of semiconductor characteristic variations is disclosed. In one embodiment, a method includes developing a solution for each of a plurality of specific forms of spatial correlations of a characteristic of a circuit design and developing a plurality of solution methods for a given spatial correlation; selecting one of the solutions that is closest to a desired spatial correlation; and modeling the desired spatial correlation using the selected solution.

18 Claims, 15 Drawing Sheets

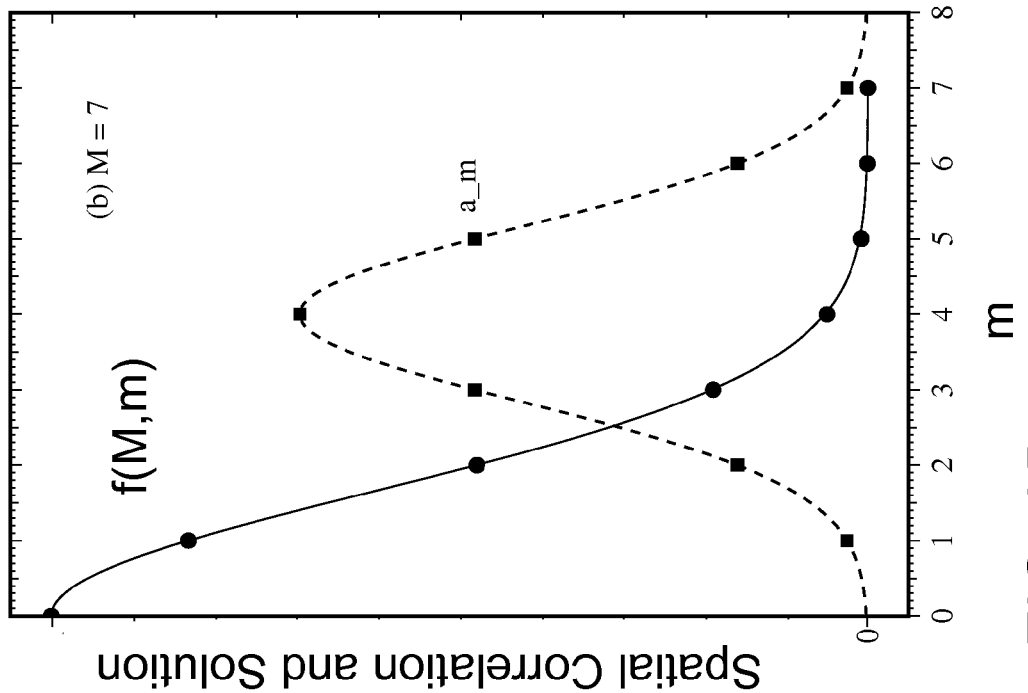
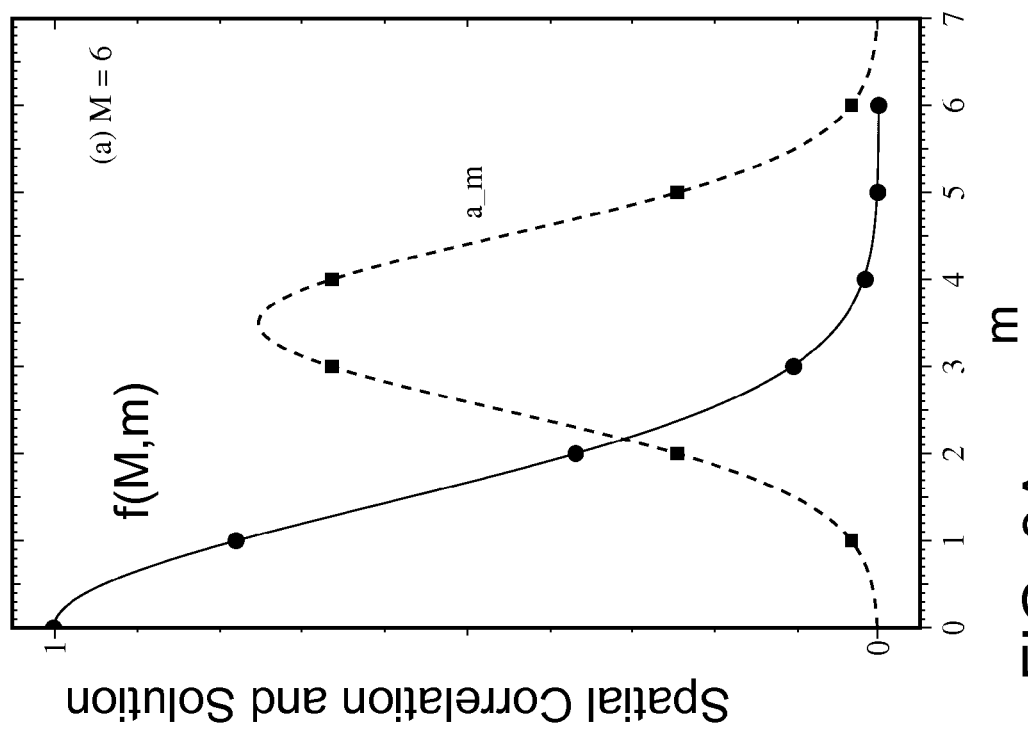
FIG. 9A
FIG. 9B

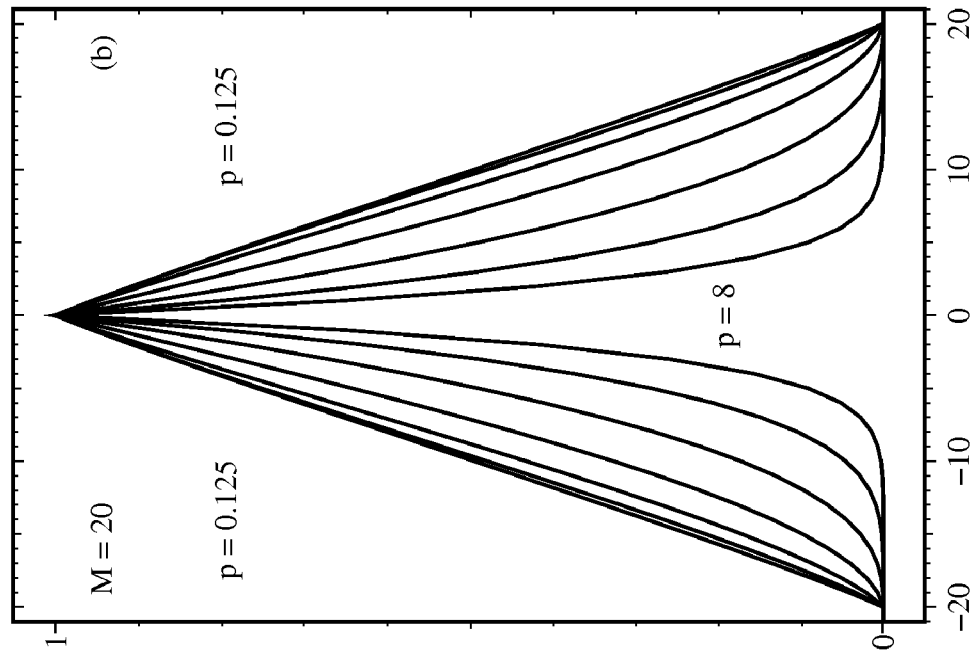
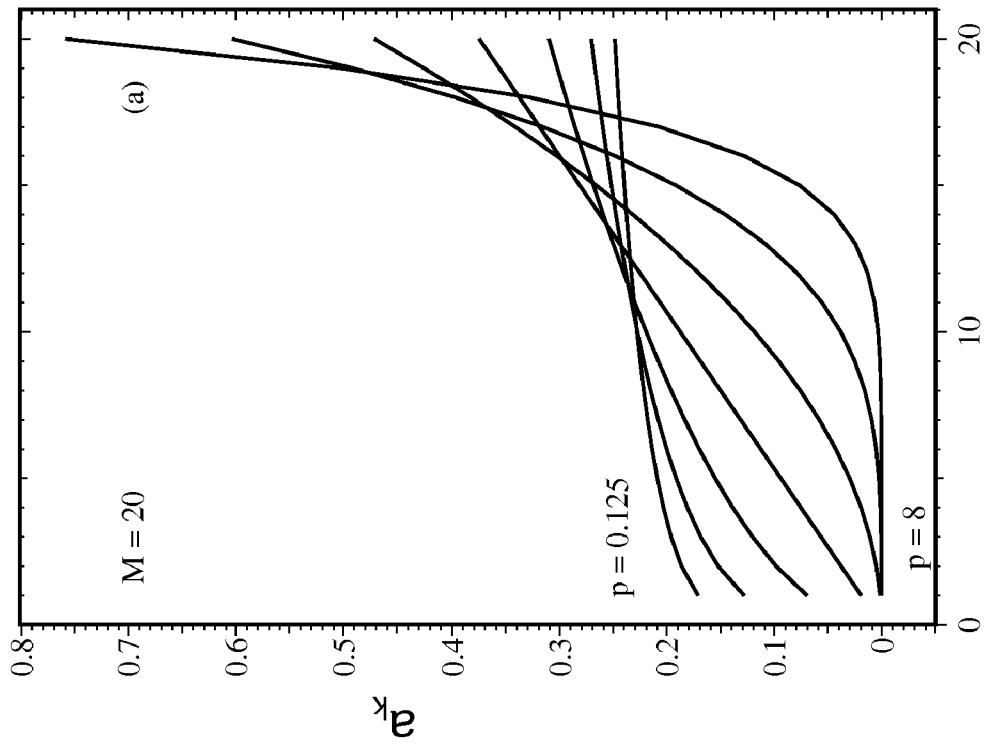
FIG. 11A
FIG. 11B

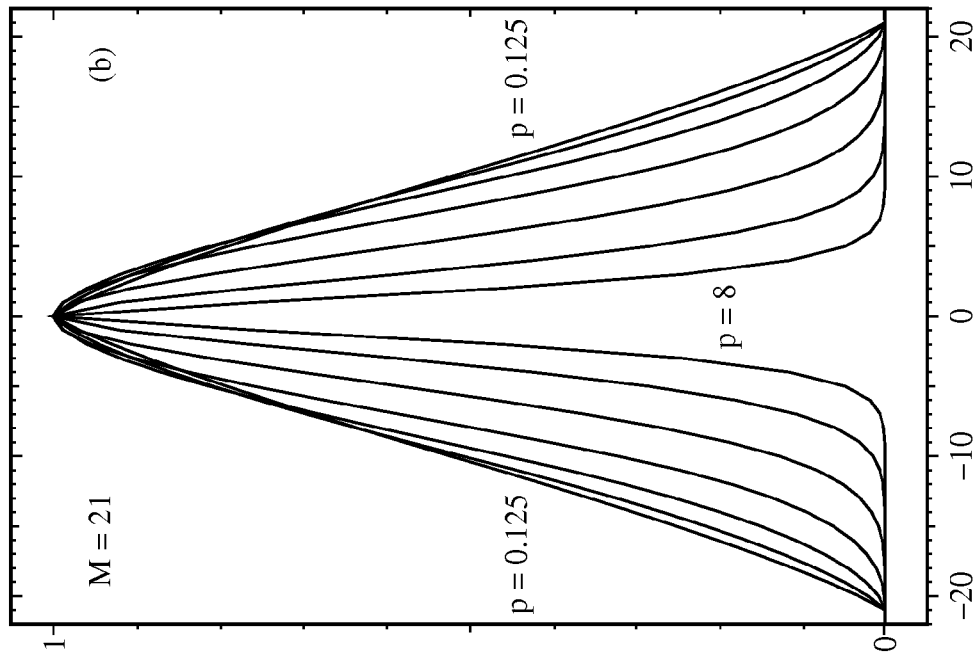
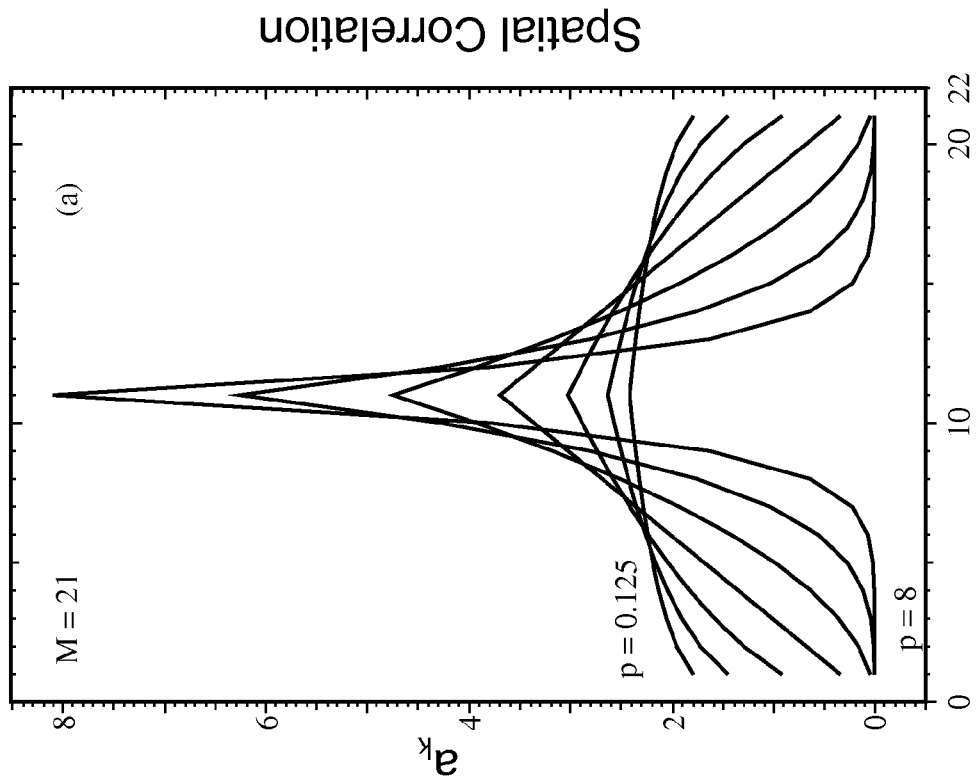
FIG. 12A
FIG. 12B

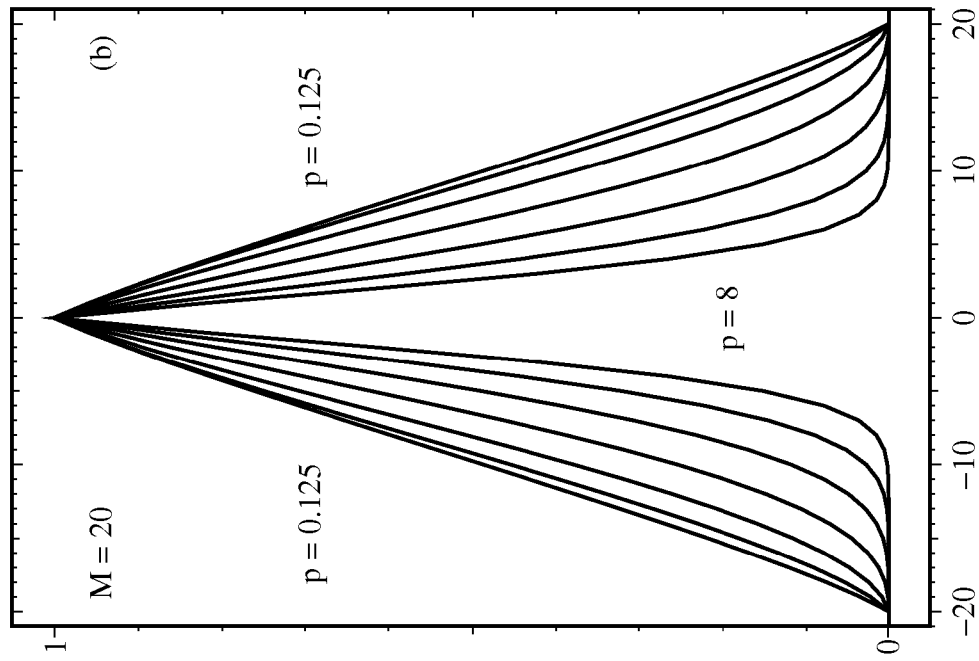
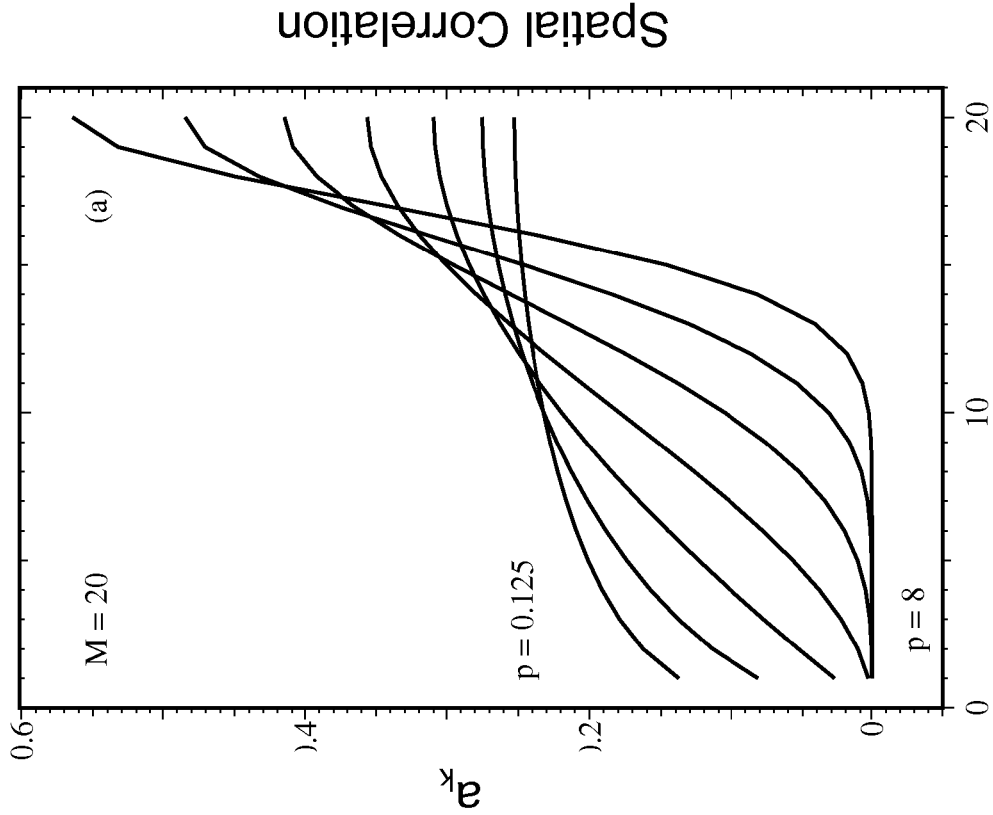
FIG. 13A
FIG. 13B

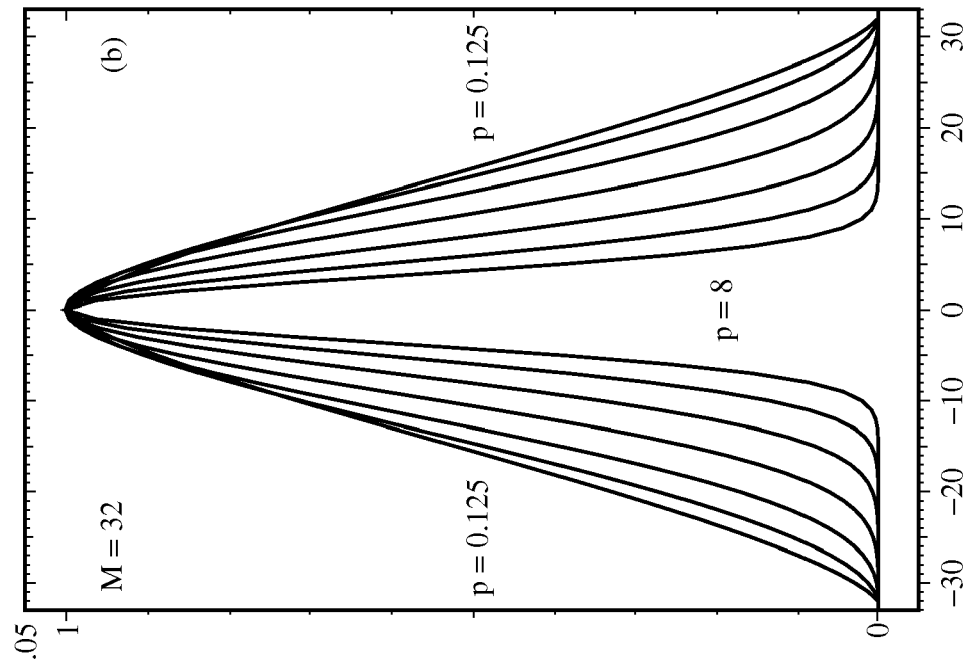
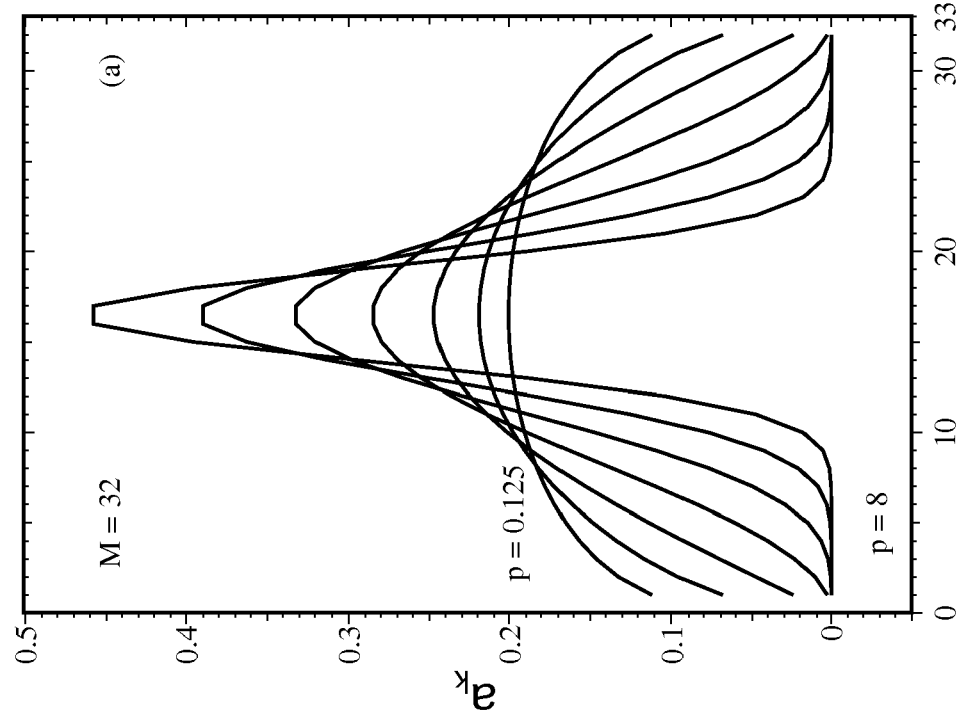
FIG. 14A
FIG. 14B

MODELING SPATIAL CORRELATIONS

BACKGROUND

1. Technical Field

The disclosure relates generally to integrated circuit (IC) chip design, and more particularly, to modeling spatial correlations of circuit design device parameters.

2. Background Art

As integrated circuit (IC) chip processing technology continues miniaturization from 65 nanometer (nm) to 45 nm to 32 nm node technologies, the variations in the semiconductor processing become larger and larger, and need for a proper analysis in device modeling and circuit simulations increases. In semiconductor processing and devices as well as in logic circuits the intra-die variations and/or inter-die variations exhibit spatial correlations. Namely, measured hardware data has shown that spatial correlations exist between two device instances (e.g., logic circuits, devices, or the electric parameters of two devices) located within a chip/die or located on different dies/chips in the same wafer. In addition, data shows that the degree of the spatial correlation generally decreases with increasing separation between the devices.

Most conventional approaches to modeling spatial correlations use a principal component analysis (PCA). However, the PCA approaches do not address how to handle the problem when one or more negative eigenvalues arise. The situation of negative eigenvalues often arises due to poorly filled in correlation coefficients. Also, the PCA approaches do not give an insight on how to extend the result to the limit of very small grid size. When the PCA approaches are used for a large number of sub-regions (i.e., for a very small grid size), it often results in many terms for each instance of a device parameter and thus leads to a much longer circuit simulation time.

SUMMARY

Modeling spatial correlations of semiconductor characteristic variations is disclosed. In one embodiment, a method includes developing a solution for each of a plurality of specific forms of spatial correlations of a characteristic of a circuit design and developing a plurality of solution methods for a given spatial correlation; selecting one of the solutions that is closest to a desired spatial correlation; and modeling the desired spatial correlation using the selected solution.

A first aspect of the disclosure provides a method comprising: developing a solution for each of a plurality of specific forms of spatial correlations of a characteristic of a circuit design and developing a plurality solution methods for a given spatial correlation; selecting one of the solutions that is closest to a desired spatial correlation; and modeling the desired spatial correlation using the selected solution.

A second aspect of the disclosure provides a system comprising: means for developing a solution for each of a plurality of specific forms of spatial correlations of a characteristic of a circuit design and for developing a plurality of solution methods for a given spatial correlation; means for selecting one of the solutions that is closest to a desired spatial correlation; and means for modeling the desired spatial correlation using the selected solution.

A third aspect of the disclosure provides a program product stored on a computer-readable medium, which when executed, models spatial correlations, the program product comprising: program code for developing a solution for each of a plurality of specific forms of spatial correlations of a characteristic of a circuit design and for developing a plurality of solution methods for a given spatial correlation; program code for selecting one of the solutions that is closest to a desired spatial correlation; and program code for modeling the desired spatial correlation using the selected solution.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 9A-B show Gaussian distribution type of spatial correlation (1.25) and corresponding Gaussian distribution type of solution (1.24) for two relatively small M values: M=6 (FIG. 9A) and M=7 (FIG. 9B) with 17=6 in both cases.

FIG. 11A shows a family of asymmetric solution curves $a_k$, Equation (1.23), and FIG. 11B shows a corresponding family of spatial correlation curves for several real power p values: p=0.125, ¼, ½, 1, 2, 4, and 8.

FIG. 12A shows a family of symmetric solution curves $a_k$, Equation (1.28), and FIG. 12B shows a corresponding family of spatial correlation curves for several real power p values: p=0.125, ¼, ½, 1, 2, 4, and 8.

FIG. 13A shows a family of asymmetric solution curves $a_k$, Equation (1.29), and FIG. 13B shows a corresponding family of spatial correlation curves for several real power p values: p=0.125, ¼, ½, 1, 2, 4, and 8.

FIG. 14A shows a family of symmetric solution curves $a_k$, Equation (1.30), and FIG. 14B shows a corresponding family of spatial correlation curves for several real power p values: p=0.125, ¼, ½, 1, 2, 4, and 8.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

I. Introduction

The present disclosure presents a method, system and program product for modeling semiconductor characteristic variability including spatial correlations in a more practical manner. Semiconductor characteristics may include variations in semiconductor processes, devices, device parameters, VLSI circuits, and circuit parameters. The model describes the correlation among a set of device instances (e.g., logic circuits, analog circuits, device parameters, or the electric parameters of two devices). Example device parameters may include field effect transistor (FET) channel length, FET channel width, diffused or poly resistor's resistance value, metal-insulator-metal capacitor's (MIMCAP's) capacitance value, the capacitance values of vertical natural capacitors (VNCAPs, BEOL metal wires formed capacitors), ring oscillator's period/speed, other logic circuits period (e.g., NAND, NOR, etc.), or other device parameters. The degree of correlation is approximately one when two device instances are very close, and the degree of correlation decreases with increasing distance between the two device instances. In order to address the problems associated with PCA approaches, a spatial correlation modeling system 100 according to the disclosure is presented. System 100 simplifies spatial correlation representation by minimizing the number of terms (e.g., by assigning only a few stochastic/random variables to each device) required for the modeling, thus improving the resources required to perform the modeling. In addition, system 100 automatically modifies/changes a set of unrealistic correlation coefficients (such as that which leads to negative eigenvalues in the PCA approach) to a set of realistic correlation coefficients, thus improving modeling accuracy.

II. System Overview

Figure 1:
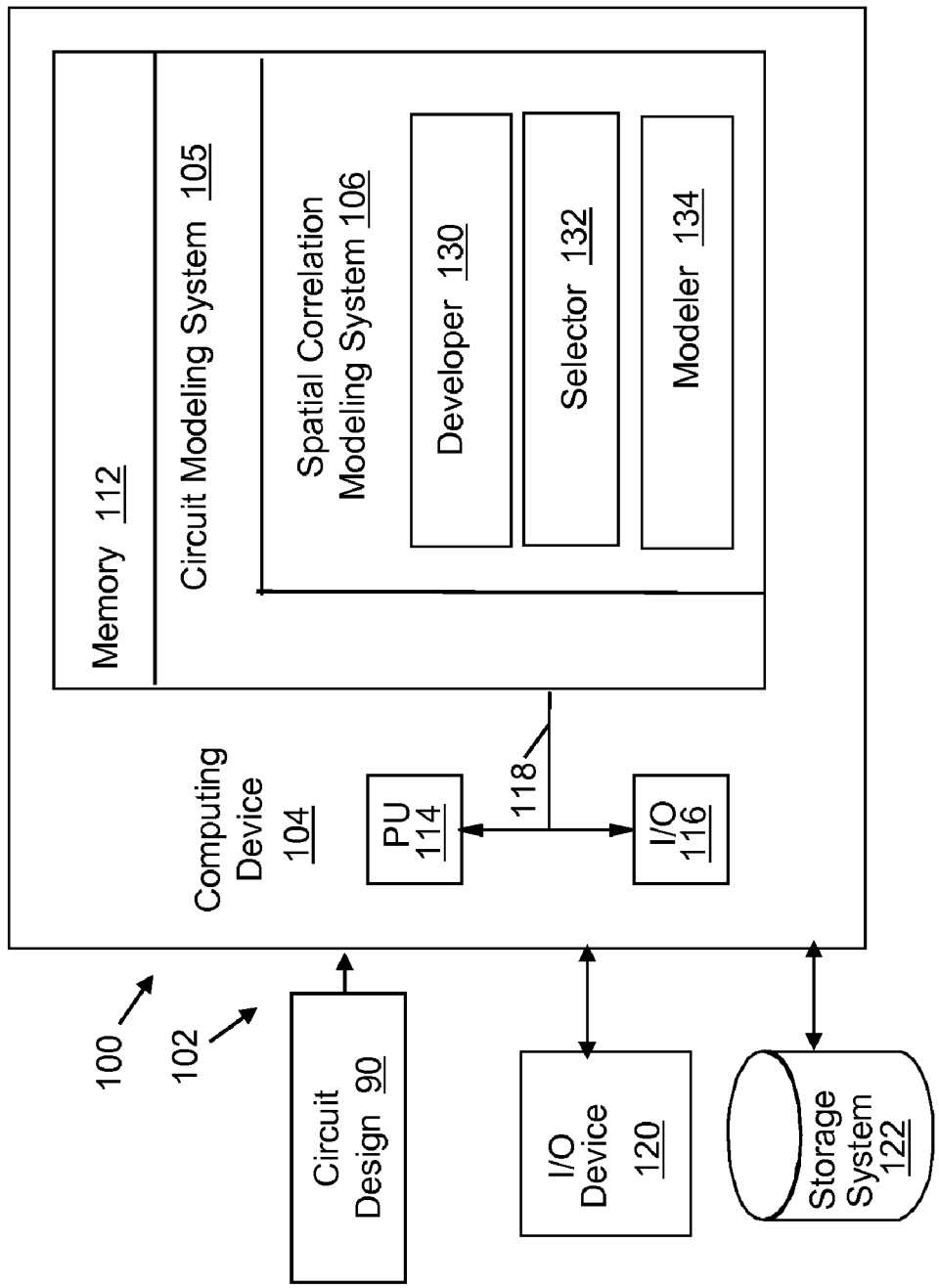
FIG. 1 shows a block diagram of a spatial correlation modeling system according to the disclosure.

Turning to the drawings, FIG. 1 shows an illustrative environment 100 for modeling spatial correlations according to the disclosure. To this extent, environment 100 includes a computer infrastructure 102 that can perform the various process steps described herein for modeling spatial correlations. In particular, computer infrastructure 102 is shown including a computing device 104 that comprises a circuit modeling system 105, which further comprises a set of device and/or circuit models, including a spatial correlation modeling system 106, which enables computing device 104 to model a circuit design 90 including the modeling of spatial correlations by performing the processes of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as a circuit modeling system 105, which includes a spatial correlation modeling system 106, which is stored in memory 112 and/or storage system 122. While executing computer program code, processor 114 can read and/or write data, such as spatial correlation modeling, to/from memory 112, storage system 122, and/or I/O interface 116. Bus 118 provides a communications link between each of the components in computing device 104. I/O device 116 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

Computing device 104 can comprise any general purpose computing article of manufacture capable of executing computer program code installed by a user (e.g., a personal computer, server, handheld device, etc.). However, it is understood that computing device 104, circuit modeling system 105, and spatial correlation modeling system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques. Circuit design 90 may be provided to circuit modeling system 105.

Circuit design 90 comprises design structure of an embodiment of a circuit to be modeled by circuit modeling system 105, which contains spatial correlation modeling system 106 according to the disclosure. Circuit design 90 may be in the form of schematics or HDL, a hardware-description language (e.g., Verilog, VHDL, C, etc.). Circuit design 90 may be contained on one or more machine readable medium. For example, circuit design 90 may be a text file or a graphical representation of a circuit design.

As previously mentioned and discussed further below, circuit modeling system 105, which includes spatial correlation modeling system 106 enables computing infrastructure 102 to model a circuit design 90 including the modeling of spatial correlations. To this extent, spatial correlation modeling system 106 within circuit modeling system 105 is shown including a developer 130, a selector 132 and a modeler 134. Operation of each of these systems is discussed further below. However, it is understood that some of the various systems shown in FIG. 1 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

III. Spatial Correlation Modeling

Referring to FIGS. 3-6, schematics of illustrative spatial correlations among a set of semiconductor characteristics are illustrated. For purposes of description, one type of characteristic in the form of device parameters will be described. It is understand that other types of characteristics may also be analyzed. Example device parameter characteristics may include field effect transistor (FET) channel length, FET channel width, diode current, diffused or poly resistor's resistance value, MIMCAP's capacitance value, VNCAP (BEOL metal wires formed capacitor) capacitance values, ring oscillator's period/speed, the speed of other logic circuits (e.g., NAND, NOR, etc.), or other device parameters. In each of the above example device parameters, each instance has the same mean value and the same standard deviation, but the correlation between any two instances vary (e.g., decrease) with the separation/distance between devices. In the intra-die/chip case, the whole chip area or a part of chip area is divided into multiple smaller regions (grid). In the following description, the mean and standard deviation for a set of stochastic/random variables located at different positions in a chip/die (or located on different chips on a wafer) are denoted as:

$$\langle x_i \rangle = x_0, \sigma_i \equiv \langle (x_i - \langle x_i \rangle)^2 \rangle^{1/2} = \sigma, i=1,2,\ldots,I, \quad (0.1)$$

where the subscript i is the chip/die index on a wafer, or the block index within a chip/die. The correlation among them may be denoted as:

$$c_{ij} \equiv \frac{\langle (x_i - \langle x_i \rangle)(x_j - \langle x_j \rangle) \rangle}{\sqrt{\langle (x_i - \langle x_i \rangle)^2 \rangle}\sqrt{\langle (x_j - \langle x_j \rangle)^2 \rangle}} \quad (0.2)$$

$$= \frac{\langle (x_i - x_0)(x_j - x_0) \rangle}{\sigma^2},$$

$$i, j = 1, 2, \ldots, I.$$

Based on the foregoing it follows that:

$$c_{ij} = c_{ji}, i,j=1,2,\ldots,I. \quad (0.3)$$

In addition, the correlation coefficients satisfy the relation:

$$|c_{ij}| \leq 1, i,j=1,2,\ldots,I. \quad (0.4)$$

Figure 3:
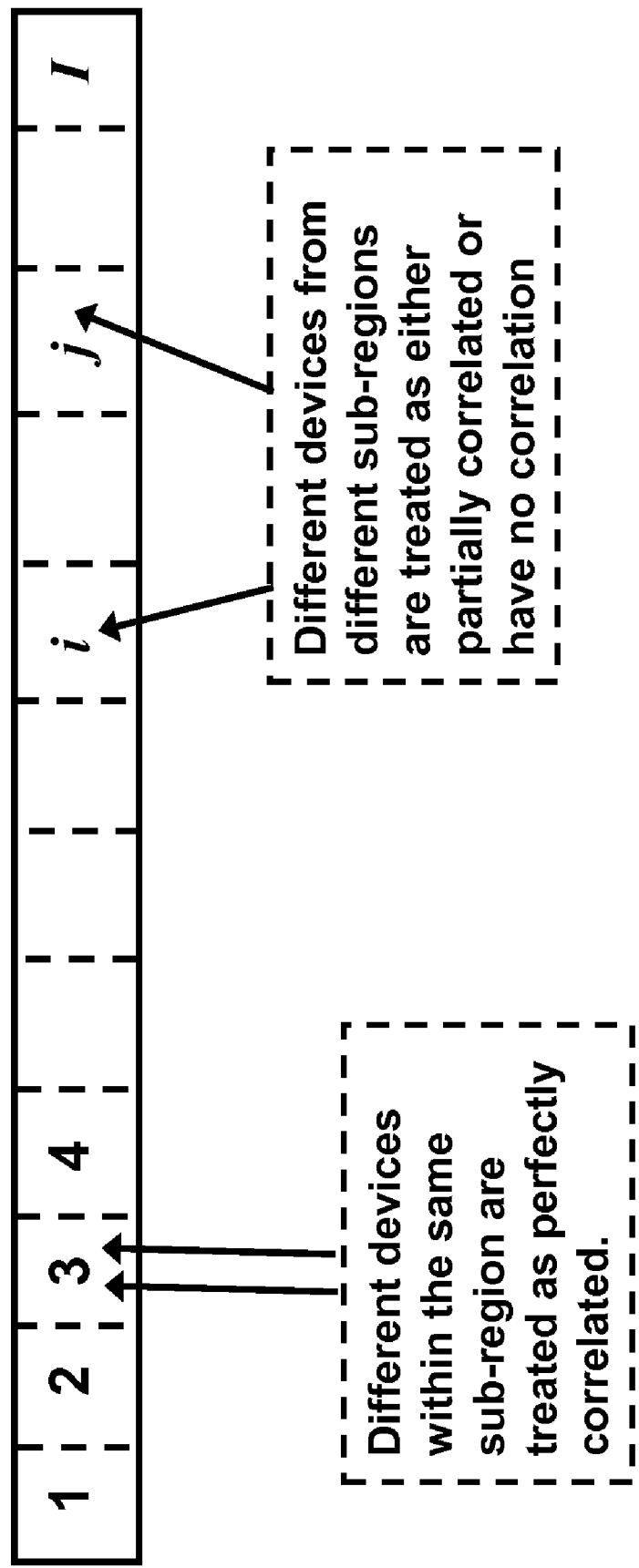
FIG. 3 shows a treatment of spatial correlation in the one-dimensional case: a strip of a chip region divided into/sub-regions.

1. One-Dimensional Spatial Correlation Cases:

Referring to FIG. 3, a schematic of a one dimensional spatial correlation case is illustrated. Here, I chips are positioned in a row (or column) on a wafer, or a strip of a chip region is divided into I sub-regions. In this case, characteristics within a common sub-region of the circuit design are treated as perfectly correlated, and characteristics in different sub-regions of the circuit design are treated as either partially correlated or completely not correlated. Illustrative analytic or numerical solutions for a number of one-dimensional spatial correlations may exist as follows:

A. A Special Nearest-Neighbor-Only Correlation for a 3-Site Case:

$$\begin{pmatrix} c_{11} & c_{12} & c_{13} \\ c_{21} & c_{22} & c_{23} \\ c_{31} & c_{32} & c_{33} \end{pmatrix} = \begin{pmatrix} 1 & 1/\sqrt{2} & 0 \\ 1/\sqrt{2} & 1 & 1/\sqrt{2} \\ 0 & 1/\sqrt{2} & 1 \end{pmatrix}. \quad (1.1)$$

Its solution is:

$$x_1 = x_0 + \sigma g_1, \quad (1.2)$$

$$x_2 = x_0 + \frac{\sigma}{\sqrt{2}}(g_1 + g_2),$$

$$x_3 = x_0 + \sigma g_2.$$

In the above and the rest of this description, each of $g_1$, $g_2$, $g_3$, . . . is an independent stochastic/random variable of mean zero and standard deviation one. If a correlation matrix such as the following is given (which gives a negative eigenvalue):

$$\begin{pmatrix} 1 & 0.8 & 0 \\ 0.8 & 1 & 0.8 \\ 0 & 0.8 & 1 \end{pmatrix},$$

then it is replaced with the correlation matrix (1.1).

B. A Special Nearest-Neighbor-Only Correlation (for an Arbitrary Number of Sites Here and in all the Following Cases):

$$c_{ii} = 1, i = 1, 2, \ldots, I; \quad (1.3)$$

$$c_{i,i+1} = c_{i+1,i} = \frac{1}{2}, i = 1, 2, \ldots, I-1;$$

$$c_{ij} = 0, i, j = 1, 2, \ldots, I, |i - j| \geq 2.$$

Its solution is:

$$x_i = x_0 + \frac{\sigma}{\sqrt{2}}(g_i + g_{i+1}), i = 1, 2, \ldots, I. \quad (1.4)$$

C. Another Special Nearest-Neighbor-Only Correlation:

$$c_{ii} = 1, i = 1, 2, \ldots, I; \quad (1.5)$$

$$c_{i,i+1} = c_{i+1,i} = -\frac{1}{2}, i = 1, 2, \ldots, I-1;$$

$$c_{ij} = 0, i, j = 1, 2, \ldots, I, |i - j| \geq 2.$$

Its solution is:

$$x_i = x_0 + \frac{\sigma}{\sqrt{2}}(g_i - g_{i+1}), i = 1, 2, \ldots, I. \quad (1.6)$$

D. A More General Nearest-Neighbor-Only Correlation:

$$c_{ii} = 1, i = 1, 2, \ldots, I; \quad (1.7)$$

$$c_{i,i+1} = c_{i+1,i} = r, i = 1, 2, \ldots, I-1, |r| \leq \frac{1}{2};$$

$$c_{ij} = 0, i, j = 1, 2, \ldots, I, |i - j| \geq 2.$$

Its solution is:

$$x_i = x_0 + \frac{\sigma(g_i\sqrt{1-a^2} + g_{i+1}a)}{\sqrt{(1+\sqrt{1-4r^2})/2}}, i=1,2,\ldots,I, a=\text{sgn}(r) \quad (1.8)$$

B is a special case of D with r=½, and C is a special case of D with r=−½.

Figure 4:
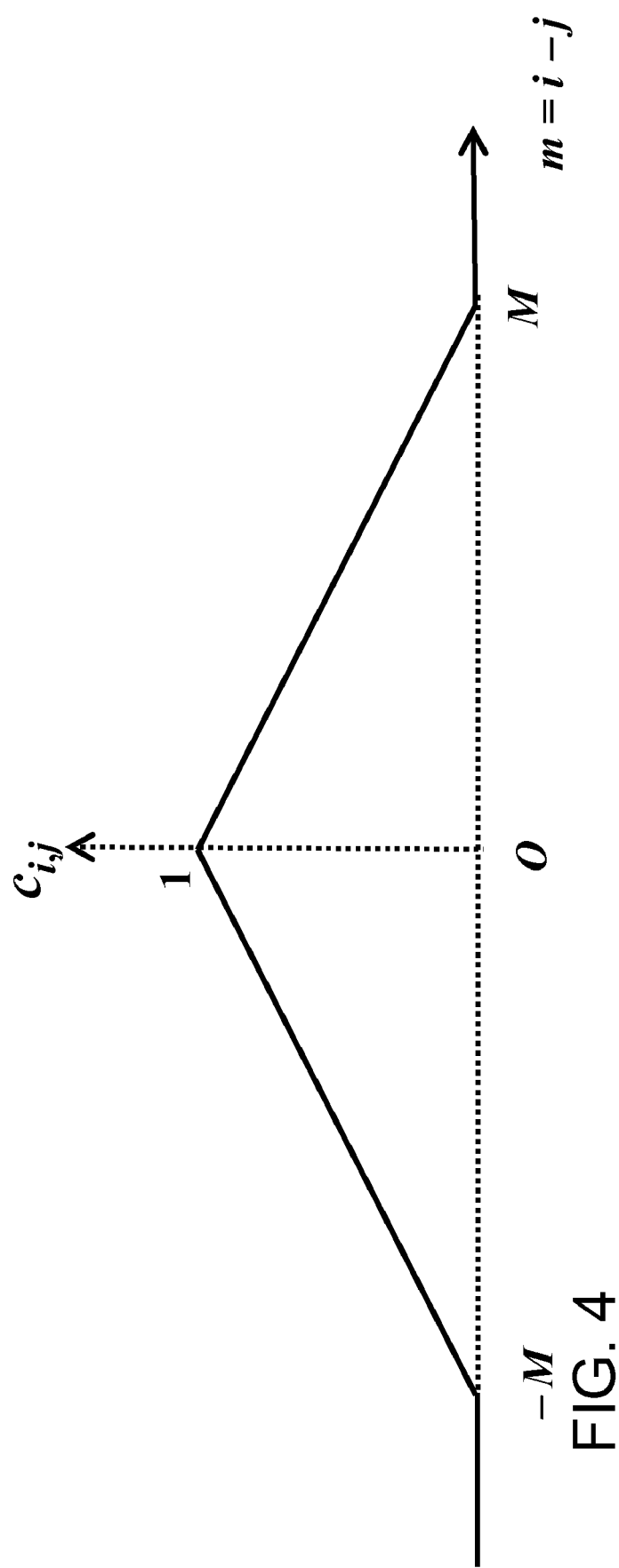
FIG. 4 illustrates a specific form of desired one-dimensional spatial correlation where the degree of correlation decreases linearly with the distance between two instances.

E. A Long-Distance and Linear-Decay Correlation:

FIG. 4 shows a schematic of an illustrative one dimensional linear-decay spatial correlation. Here, an analytic solution may be as follows:

$$c_{i,i+m} = c_{i+m,i} = 1 - \frac{m}{M}, i = 1, 2, \ldots, I - m, \quad (1.9a)$$
$$m = 0, 1, 2, \ldots, M;$$

$$c_{ij} = 0, i, j = 1, 2, \ldots, I, |i-j| \geq M. \quad (1.9b)$$

When $M \geq I$, none of correlation element $c_{ij}$ is zero and relation (1.9b) will not be used. The degree of correlation between any two sub-regions i and (i+m) is independent of the sub-region index i, i.e., the degree of correlation is translational invariant.

Its solution is:

$$x_i = x_0 + \frac{\sigma}{\sqrt{M}} \sum_{j=i}^{i+M-1} g_j = x_0 + \frac{\sigma}{\sqrt{M}} \sum_{k=1}^{M} g_{i+k-1}, \quad (1.10)$$
$$i = 1, 2, \ldots, I.$$

B is a special case of E with M=2.

F. A Special Long-Distance (Absolute Value Being Linear) Correlation:

$$c_{i,i+m} = c_{i+m,i} = (-1)^m \left(1 - \frac{m}{M}\right), i = 1, 2, \ldots, I - m, \quad (1.11a)$$
$$m = 0, 1, 2, \ldots, M;$$

$$c_{ij} = 0, i, j = 1, 2, \ldots, I, |i-j| \geq M. \quad (1.11b)$$

When $M \geq I$, none of correlation element $c_{ij}$ is zero and relation (1.11b) will not be used.

Its solution is:

$$x_i = x_0 + \frac{\sigma}{\sqrt{M}} \sum_{j=i}^{i+M-1} (-1)^{j-i} g_j = x_0 + \frac{\sigma}{\sqrt{M}} \sum_{k=1}^{M} (-1)^{k-1} g_{i+k-1}, \quad (1.12)$$
$$i = 1, 2, \ldots, I.$$

C is a special case of F with M=2.

G. A General Long-Distance Correlation:

Consider a one-dimensional correlation which is translational invariant and has a correlation range of (M−1) sub-regions:

$$c_{i,i+m} = c_{i+m,i} = f(M,m), f(M,0)=1, f(M,M)=0,$$
$$i=1,2,\ldots,I-m, m=0,1,2,\ldots,M; \quad (1.13a)$$

$$c_{ij}=0, i,j=1,2,\ldots,I, |i-j| \geq M. \quad (1.13b)$$

When $M \geq I$, none of correlation element $c_{ij}$ is zero and relation (1.13b) will not be used.

Its solution is of the form:

$$x_i = x_0 + \sigma \sum_{j=i}^{i+M-1} a_{j-i+1} g_j = x_0 + \sigma \sum_{k=1}^{M} a_k g_{i+k-1}, \quad (1.14)$$
$$i = 1, 2, \ldots, I,$$

where M coefficient $a_k$ satisfy M conditions:

$$f(M, m) = \sum_{k=1}^{M-m} a_k a_{k+m}, m = 0, 1, 2, \ldots, M - 1. \quad (1.15a)$$

One of the M conditions is the normalization condition, $$\sum_{k=1}^{M} a_k^2 = 1. \quad (1.15b)$$

If $a_1, a_2, \ldots, a_M$ are a set of solution, then $-a_1, -a_2, \ldots, -a_M$ are also a set of solution. And two sets of solution lead to identical spatial correlation f(M, m). E is a special case of G with f(M,m)=1−m/M and $a_k=1/\sqrt{M}$. This is a pair of a spatial correlation and its exact and analytic solution. F is a special case of G with f(M,m)=$(-1)^m$(1−m/M) and $a_k=(-1)^{k-1}/\sqrt{M}$. D is a special case of G with M=2: f(2, 1)=r, $a_1=\sqrt{1-a^2}$, and $a_2=a$. For M=3, here is an example. For a correlation specified by:

$$f(3, 1) = \frac{2b}{1 + 2b^2}, \quad (1.16)$$
$$f(3, 2) = \frac{b^2}{1 + 2b^2},$$

its solution is:

$$a_2 = \frac{1}{\sqrt{1 + 2b^2}}, \quad (1.17)$$
$$a_1 = a_3$$
$$= \frac{b}{\sqrt{1 + 2b^2}}.$$

For M=3 and arbitrarily given f(3, 1) and f(3, 2), relations (1.15) become:

$$a_1^2 + a_2^2 + a_3^2 = 1,$$
$$a_2(a_1+a_3) = f(3,1),$$
$$a_1 a_3 = f(3,2). \quad (1.18)$$

Instead of solving three unknowns $a_1$, $a_2$, and $a_3$, the following may be used:

$$a_1 = \sin \theta \cos \phi,$$
$$a_3 = \sin \theta \sin \phi,$$
$$a_2 = \cos \theta. \quad (1.19)$$

Then, Equations. (1.18) become:

$$\sin \theta \cos \theta (\sin \phi + \cos \phi) = f(3,1),$$
$$\sin^2 \theta \sin \phi \cos \phi = f(3,2). \quad (1.20)$$

Equations (1.20) are two equations for two unknowns, and are easier to solve than Equations (1.18).

H. Trial Approach to Find Analytic Solutions for some spatial correlations:

Often, it is easier to first try an expression for $a_k$ and then find corresponding spatial correlation analytically. An example: Let $a_k$ vary linearly with k, $$a_k = k\sqrt{\frac{6}{M(M+1)(2M+1)}}, k = 1, 2, \ldots, M. \quad (1.21)$$

Then, it is straightforward to find the corresponding form of spatial correlation, $$f(M, m) = \left(1 - \frac{m}{M}\right)\left(1 - \frac{m}{M+1}\right)\left(1 + \frac{m}{2M+1}\right), \quad (1.22)$$
$$m = 1, 2, \ldots, M.$$

This is another pair of a spatial correlations and its exact and analytic solution. When $a_k$'s are proportional to a positive integer power of k, $$a_k = \beta k^p, k=1,2,\ldots,M, \quad (1.23)$$

with p being a positive integer and $\beta$ being a normalization constant, an exact and analytic expression for $f(M, m)$ can also be found.

Another example of analytic solution: Let $a_k$ form a (truncated) Gaussian distribution with a standard deviation $s_1 = M/\eta$ and centered at $\frac{1}{2}(M+1)$, $$a_k = \frac{\beta_0}{\sqrt[4]{\pi}}\sqrt{\frac{\eta}{M\,\text{erf}(\eta/2)}}\exp\left[-\frac{\eta^2(k-k_0)^2}{2M^2}\right], \quad (1.24)$$
$$k = 1, 2, \ldots, M, k_0 = \frac{1}{2}(M+1),$$

where erf(x) is the error function, and $\beta_0$ is a normalization constant due to discrete summation in Equation (1.15b) and is very close to one. For a large M, Equation (1.24) covers the Gaussian distribution from $-\frac{1}{2}\eta s_1$ to $+\frac{1}{2}\eta s_1$. The corresponding spatial correlation is also a (truncated) Gaussian distribution, but with a larger standard deviation $s_2 = \sqrt{2}M/\eta$, $$f(M, m) = \exp\left(-\frac{\eta^2 m^2}{4M^2}\right), m = 1, 2, \ldots, M - 1. \quad (1.25)$$

For a large M, the resulting spatial correlation (1.25) spans the Gaussian distribution from $-\eta s_2/\sqrt{2}$ to $+\eta s_2/\sqrt{2}$. The parameter $\eta$ needs to be large enough (say, $\eta \geq 6$) to reduce the truncation error. FIGS. 9A-B show plots of the Gaussian distribution type of spatial correlation (1.25) (FIG. 9A) and corresponding analytic solution (1.24) (FIG. 9B). Still another example of analytic solution: Let $a_k$ form a (truncated) Lorentzian distribution with a "half width at half height" (HWHH) $w_1 = M/(2\eta)$, $$a_k = \frac{\beta}{1 + [2\eta(k-k_0)/M]^2}, \quad (1.26)$$
$$k = 1, 2, \ldots, M, k_0 = \frac{1}{2}(M+1),$$

where $\beta$ is a normalization constant. For a large M, Equation (1.26) covers the Lorentzian distribution from $-\eta w_1$ to $+\eta w_1$. The corresponding spatial correlation is also a (truncated) Lorentzian distribution, but with a twice larger HWHH $w_2 = M/\eta$, $$f(M, m) = \frac{1}{1 + (\eta m/M)^2}, m = 1, 2, \ldots, M - 1. \quad (1.27)$$

Figure 10:
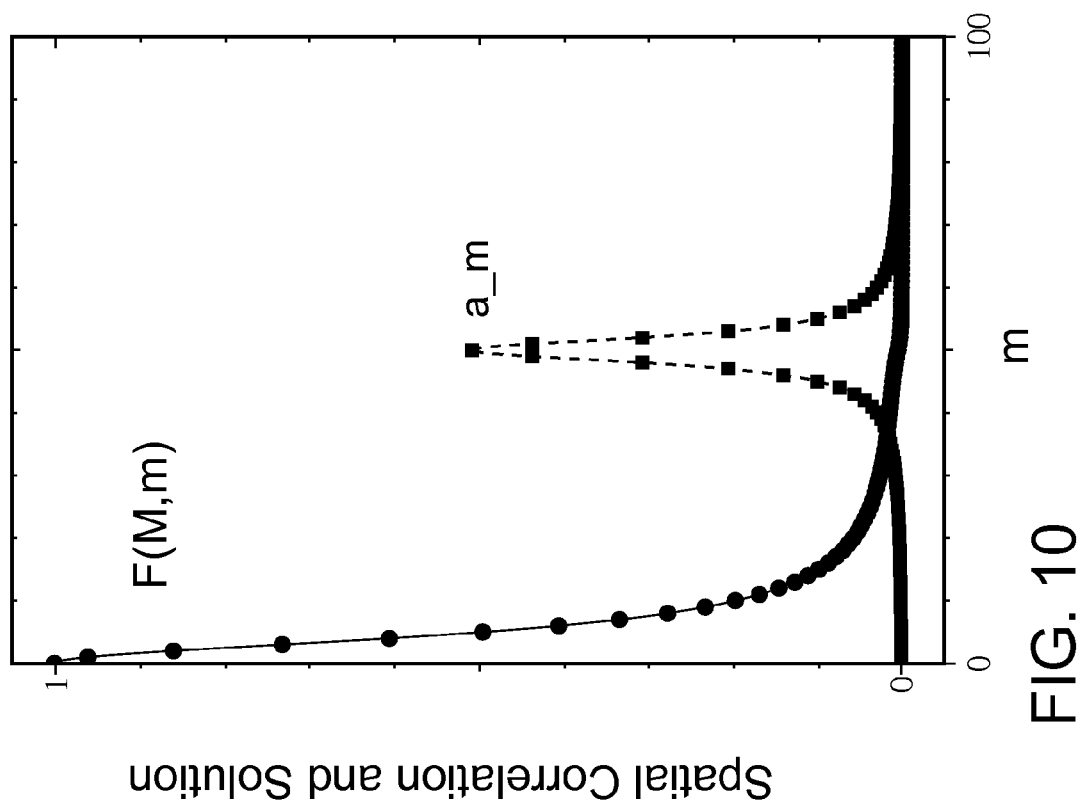
FIG. 10 shows Lorentzian distribution type of spatial correlation (1.27) and corresponding Lorentzian distribution type of solution (1.26) for M=99 and $\eta$=20.

For a large M, the resulting spatial correlation (1.27) spans the Lorentzian distribution from $-\eta w_2$ to $+\eta w_2$. The parameter $\eta$ needs to be large enough to reduce the truncation error. FIG. 10 illustrates the Lorentzian distribution type of spatial correlation (1.27) and corresponding analytic solution (1.26).

I. Trial Approach to Find Numerical Solutions for Various Forms of Spatial Correlations:

In practice, it is straightforward to first try an expression for $a_k$ and then calculating corresponding spatial correlation numerically. FIGS. 11A-B show plots of a family of solution $a_k$ curves in Equation (1.23) with p being a real value and also plots a family of corresponding spatial correlations, respectively. All spatial correlations in this family have a sharp peak at the center m=0. Changing $a_k$ in Equation (1.23) to a symmetric form about the middle k value, one has $$a_k = \beta k^p, k \leq \frac{1}{2}(M+1) = k_0,$$

$$a_k = \beta(M+1-k)^p, k > k_0, \quad (1.28)$$

where $\beta$ is a normalization constant. FIGS. 12A-B show solution $a_k$ curves in Equation (1.28) and corresponding spatial correlations for several power p values, respectively. Some of spatial correlations in this family have a smoother peak at the center m=0. Various other forms of $a_k$ curves are easily constructed. Here are two additional families of $a_k$ curves. FIGS. 13A-B show the following family of asymmetric solution $a_k$ curves, $$a_k = \beta[3(k/M)^2 - 2(k/M)^3]^p, k=1,2,\ldots,M, \quad (1.29)$$

and corresponding spatial correlations for several power p values, respectively. All spatial correlations in this family have a sharp peak at the center m=0. FIGS. 14A-B plot the following family of symmetric solution $a_k$ curves, $$a_k = \beta \sin^{2p}[\pi k/(M+1)], k=1,2,\ldots,M, \quad (1.30)$$

and corresponding spatial correlations for several power p values, respectively. Most of spatial correlations in this family have a smoother peak at the center m=0.

J. The Approach of the Fourier Transform:

For an arbitrarily given spatial correlation $c_{i,i+m}$, a set of symmetric solution, $$a_{M-k} = a_{1+k}, k = 0, 1, \ldots, \left\lfloor\frac{1}{2}M\right\rfloor - 1, \quad (1.31)$$

is sought. Substituting relation (1.31) into Equation (1.15a), the given spatial correlation f(M, m) is found to be a (discrete) convolution of $a_k$ function with itself, $$f(M, m) = \sum_{k=1}^{M-m} a_k a_{1+M-m-k}, m = 0, 1, 2, \ldots, M - 1. \quad (1.32)$$

Thus, the Fourier transform can be used to find solution $a_k$. The following are the specific steps:

i) Extend the definition of the given spatial correlation f(M, m) from m being an integer to m being a real number.

ii) Obtain the Fourier transform $\phi(\omega)$ of the given spatial correlation $c_{i,i+m}$, $$\phi(\omega) = \int_{-\infty}^{+\infty} c_{i,i+m} e^{j\omega m} dm \qquad (1.33)$$
$$= 2\int_0^M f(M, m)\cos(\omega m) dm,$$

where the $2^{nd}$ expression in (1.33) is the result of using a fact that the spatial correlation is symmetric in m, $c_{i,i+m}=c_{i,i-m}=f(M, m)$ [also see Equation (1.13a)] and of using Equation (1.13b). Thus, the Fourier transform $\phi(\omega)$ is real and symmetric, $\phi(\omega)=\phi(-\omega)$.

iii) Get the Fourier transform $\alpha(\omega)$ of solution $a_k$ function from the Fourier transform $\phi(\omega)$ of the given spatial correlation f(M, m), $$\alpha(\omega)=\pm\sqrt{\phi(\omega)}, \text{ when } \phi(\omega)\geq 0, \qquad (1.34a)$$

$$\alpha(\omega)=0, \text{ when } \phi(\omega)<0. \qquad (1.34b)$$

Namely, $$\alpha(\omega)=\pm\sqrt{\max(\phi(\omega),0)}. \qquad (1.34c)$$

If a local minimum in $\phi(\omega)$ is zero at a point, then $\alpha(\omega)$ changes its sign when $\omega$ crosses that point. If a Fourier transform $\phi(\omega)$ is negative in some regions, then it implies that the original correlation matrix formed by $c_{i,j}$ has one or more negative eigenvalues and is unrealistic. Such unrealistic correlation coefficients are corrected effectively and automatically by the max operation in Equation (1.34c). The Fourier transform $\alpha(\omega)$ given by Equations (1.34) is also real and symmetric, $\alpha(\omega)=\alpha(-\omega)$.

iv) Obtain the solution $a_k$ through the corresponding inverse Fourier transform, $$a_k = \frac{\beta_0}{2\pi}\int_{-\infty}^{+\infty} \alpha(\omega)e^{-j\omega(k-k_0)} d\omega \qquad (1.35)$$
$$= \frac{\beta_0}{\pi}\int_0^{+\infty} \alpha(\omega)\cos[\omega(k-k_0)] d\omega,$$
$$k = 1, 2, \ldots, M, k_0 = \frac{1}{2}(M+1),$$

which are real. In Equation (1.35), $\beta_0$ is a normalization constant due to discrete summation in Equation (1.15b). It is easy to see that solution (1.35) is indeed symmetric, i.e., solution (1.35) implies relation (1.31). The constant solution (1.10), Gaussian distribution solution (1.24), and Lorentzian distribution (1.26) can also be obtained using the Fourier transform approach.

If there are one or more $\omega$ regions where $\phi(\omega)$ is negative, then there are two or more $\omega$ regions where $\phi(\omega)$ is positive. Choosing plus sign (+) for $\alpha(\omega)$ in one region but choosing plus or minus sign for $\alpha(\omega)$ in another region leads to two or more solutions for $\alpha(\omega)$ as a whole and thus leads to two or more sets of solutions for $a_k$. Compute a spatial correlation starting from each set of $a_k$ solution, and choose one set of $a_k$ solution which gives the closest spatial correlation to the original spatial correlation f(M, m) as the true solution. In this approach, any unrealistic correlation coefficients are corrected effectively and automatically.

Figure 5:
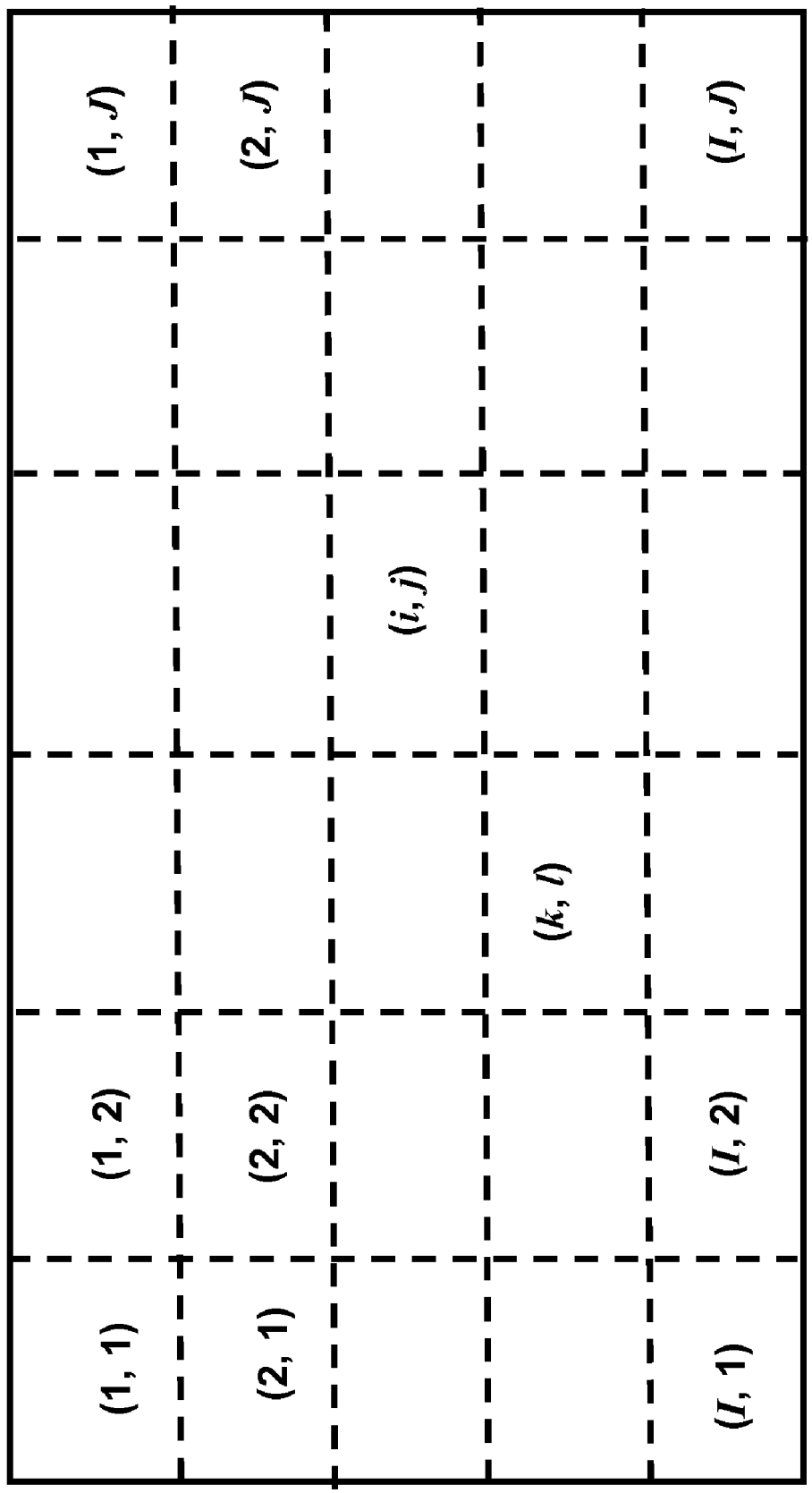
FIG. 5 shows a treatment of spatial correlations in the two-dimensional case: a chip/die region divided into (I×J) sub-regions.

2. Two-Dimensional Spatial Correlation Cases:

FIG. 5 shows a schematic of an illustrative two dimensional spatial correlation case in which a chip/die region is divided into (I×J) sub-regions or I rows and J columns of chips on a wafer. Here, C(i, j; k, l) is used to denote the correlation coefficient between a characteristic in sub-region (i, j) and another characteristic in sub-region (k, l).

A. A Special Nearest-Neighbor-Only Correlation (Correlation Range is 1 Unit in Either x or y Direction, but Not in a Diagonal Direction):

$C(i, j; i, j) = 1, i = 1, 2, \ldots, I, j = 1, 2, \ldots, J;$ $C(i, j; i+1, j) = C(i+1, j; i, j) = r,$ $i = 1, 2, \ldots, I-1, j = 1, 2, \ldots, J, r \leq \frac{\sqrt{2}}{4};$ $C(i, j; i, j+1) = C(i, j+1; i, j) = r,$ $i = 1, 2, \ldots, I, j = 1, 2, \ldots, J-1, r \leq \frac{\sqrt{2}}{4};$ all other $C(i,j;k,l)=0, i,k=1,2,\ldots,I, j,l=1,2,\ldots,J.$ (2.1)

The solution is:

$x_{i,j}=x_0+\sigma(g_{i,j}\sqrt{1-2b^2}+g_{i+1,j}b+g_{i,i+1}b), i=1,2,\ldots,I,$
$j=1,2,\ldots,J, b=\frac{1}{2}\text{sgn}(r)\sqrt{1+\sqrt{1-8r^2}}.$ (2.2)

For example, when $r=\frac{1}{3}$, the solution (2.2) is simplified to $$x_{i,j} = x_0 + \frac{\sigma}{\sqrt{3}}(g_{i,j} + g_{i+1,j} + g_{i,j+1}),$$
$$i = 1, 2, \ldots, I, j = 1, 2, \ldots, J.$$

B. Another Special Nearest-Neighbor-Only Correlation (Correlation Range is 1 Unit in Either x or y or Diagonal Directions):

$C(i, j; i, j) = 1, i = 1, 2, \ldots, I, j = 1, 2, \ldots, J;$ $C(i, j; i+1, j) = C(i+1, j; i, j) = \frac{1}{2}, i = 1, 2, \ldots,$ $I-1, j = 1, 2, \ldots, J; C(i, j; i, j+1) = C(i, j+1; i, j) = \frac{1}{2},$ $i = 1, 2, \ldots, I, j = 1, 2, \ldots, J-1; C(i, j; i+1, j+1) =$ $C(i+1, j+1; i, j) = C(i, j+1; i+1, j) = C(i+1, j; i, j+1) =$ $\frac{1}{4}, i = 1, 2, \ldots, I-1, j = 1, 2, \ldots, J-1;$ all other $C(i,j;k,l)=0, i,k=1,2,\ldots,I, j,l=1,2,\ldots,J.$ (2.3)

The solution is:

$$x_{i,j} = x_0 + \frac{\sigma}{2}(g_{i,j} + g_{i+1,j} + g_{i,j+1} + g_{i+1,j+1}), \qquad (2.4)$$
$$i = 1, 2, \ldots, I, j = 1, 2, \ldots, J.$$

Relation (2.4) can be viewed as the result of extending one-dimensional relation (1.4) to the two-dimensional case. Other results for the one-dimensional case can be similarly extended to the two-dimensional case.

C. A General Long-Distance Correlation:

Consider a two-dimensional correlation which is translational invariant, and has a correlation range of (M−1) rows in the row direction and of (N−1) columns in the column direction.

$$C(i,j;i+m,j+n)=C(i+m,j+n;i,j)=C(i,j+n;i+m,j)=C(i+m,j;i,j+n)=F(M,m;N,n),$$

$$F(M,0;N,0)=1, F(M,M;N,n)=0, F(M,m;N,N)=0,$$

$$i=1,2,\ldots,I-m,\ m=0,1,2,\ldots,M,\ j=1,2,\ldots,J-n,\ n=0,1,2,\ldots,N;$$

$$C(i,j;k,l)=0,\ i,k=1,2,\ldots,I,\ j,l=1,2,\ldots,J,\ |i-k|\geq M\ \text{or}\ |j-l|\geq N. \quad (2.5)$$

Its solution is of the form:

$$x_{ij} = x_0 + \sigma \sum_{k=1}^{M}\sum_{l=1}^{N} A_{kl} g_{i+k-1,j+l-1}, \quad (2.6)$$

$$i=1,2,\ldots,I,\ j=1,2,\ldots,J,$$

where MN coefficients $A_{kl}$ satisfy MN conditions, $$F(M,m;N,n) = \sum_{k=1}^{M-m}\sum_{l=1}^{N-n} A_{k,l} A_{k+m,l+n}, \quad (2.7a)$$

$$m=0,1,2,\ldots,M-1,\ n=0,1,2,\ldots,N-1.$$

One of the MN conditions is the normalization condition:

$$\sum_{k=1}^{M}\sum_{l=1}^{N} A_{kl}^2 = 1, \quad (2.7b)$$

Equations (2.5) to (2.7b) can be viewed as the result of extending one-dimensional relation (1.13)-(1.15) to the two-dimensional case.

D. A Special Long-Distance Correlation and Corresponding Solution:

When $A_{kl}=1/\sqrt{MN}$ (independent of index kl), Eq. (2.7b) is satisfied and Eq. (2.7a) becomes:

$$F(M,m;N,n) = \left(1-\frac{m}{M}\right)\left(1-\frac{n}{N}\right), \quad (2.8)$$

$$m=0,1,2,\ldots,M,\ n=0,1,2,\ldots,N.$$

Figure 6:
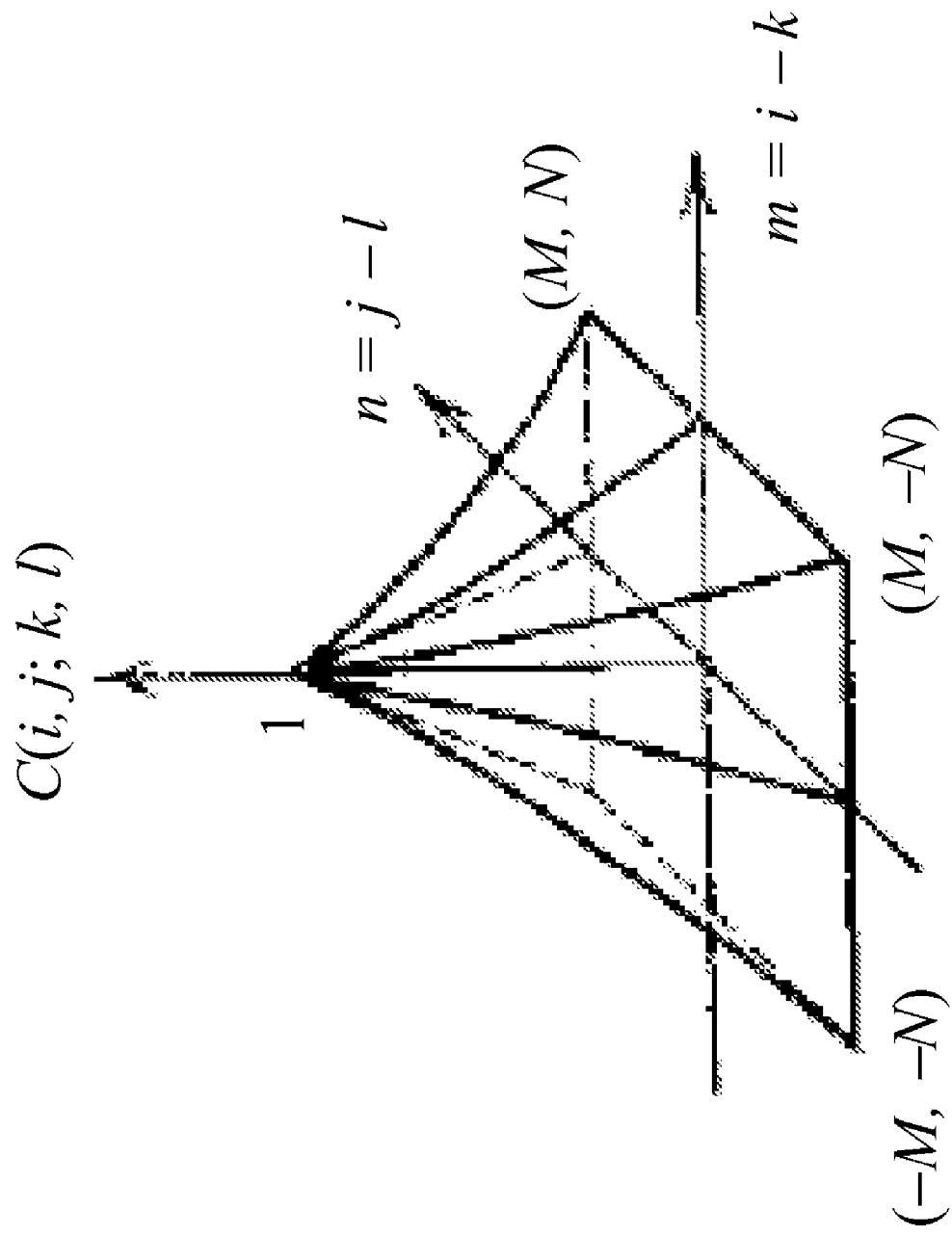
FIG. 6 illustrates a specific form of desired two-dimensional spatial correlation where the degree of correlation decreases with the distance between two instances in a bi-linear form.

Equation (2.8) is a bi-linear decay spatial correlation. FIG. 6 shows a schematic of an illustrative two dimensional bi-linear-decay spatial correlation. Equation (2.8) can be viewed as the result of extending one-dimensional linear-decay relation (1.9a) to the two-dimensional case.

E. A General Method of Constructing a Two-Dimensional Solution from a One-Dimensional Solution:

For any one-dimensional spatial correlation and solution, the corresponding two-dimensional correlation and solution can be generated by the following decomposition method:

$$A_{kl}=a_k a_l,$$

$$F(M,m;N,n)=f(M,m)f(N,n), \quad (2.9)$$

where $a_k$ and f(M, m) satisfy relations (1.15), and similarly for $a_l$ and f(N, n).

The above-described solutions are meant to be illustrative only, other possibilities may exist. In any event, the above-described solutions present a solutions for each of a plurality of specific forms of spatial correlations of a characteristic (e.g., semiconductor processes, devices, device parameters, VLSI circuits, circuit parameters, etc.) of a circuit design.

F. The Method of the Fourier Transform:

For an arbitrarily given spatial correlation C(i, j; k, l), a set of symmetric solution, $$A_{M-k,N-l} = A_{1+k,N-l} = A_{M-k,1+l} = A_{1+k,1+l}, \quad (2.10)$$

$$k=0,1,\ldots,\left\lfloor\frac{1}{2}M\right\rfloor-1,\ l=0,1,\ldots,\left\lfloor\frac{1}{2}N\right\rfloor-1,$$

is sought. Substituting relation (2.10) into Equation (2.7a), the given spatial correlation F(M, m; N, n) is found to be a (discrete) convolution of $A_{k,l}$ function with itself, $$F(M,m;N,n) = \sum_{k=1}^{M-m}\sum_{l=1}^{N-n} A_{k,l} A_{1+M-m-k,1+M-n-l}, \quad (2.11)$$

$$m=0,1,2,\ldots,M-1,\ n=0,1,2,\ldots,N-1.$$

Thus, the Fourier transform can be used to find solution $A_{k,l}$. The following are the specific steps:

i) Extend the definition of the given spatial correlation F(M, m; N, n) from both m and n being integers to both m and n being real.

ii) Obtain the Fourier transform $\Phi(\omega, v)$ of the given spatial correlation C(i, j; k, l), $$\Phi(\omega,v) = \int_{-\infty}^{+\infty}\int_{-\infty}^{+\infty} C(i,i+m;j,j+n) e^{j(\omega m + vn)} dn dm \quad (2.12)$$

$$= 4\int_0^M \int_0^N F(M,m;N,n)\cos(\omega m)\cos(vn) dn dm,$$

where the $2^{nd}$ expression in Equation (2.12) is the result of using facts that the spatial correlation is symmetric in both m and n and the ranges of the spatial correlation are set to be finite [also see Equation (2.5)]. Thus, the Fourier transform $\Phi(\omega, v)$ is real and is symmetric in both $\omega$ and v, $$\Phi(\omega,v)=\Phi(-\omega,v)=\Phi(\omega,-v)=\Phi(-\omega,-v).$$

iii) Get the Fourier transform $\alpha(\omega, v)$ of solution $A_{k,l}$ function from the Fourier transform $\Phi(\omega, v)$ of the given spatial correlation F(M, m; N, n), $$\beta(\omega,v)=\pm\sqrt{\max(\Phi(\omega,v),0)}. \quad (2.13)$$

If a Fourier transform $\Phi(\omega, v)$ is negative in some regions, then it implies that the original correlation matrix formed by C(i, j; k, l) has one or more negative eigenvalues and is unrealistic. Such unrealistic correlation coefficients are corrected effectively and automatically by the max operation in Equation (2.13). The Fourier transform $\alpha(\omega, v)$ given by Equations (2.13) is also real and symmetric, B($\omega$, v)=B(−$\omega$, v)=B($\omega$, −v)=B(−$\omega$, −v).

iv) Obtain the solution $A_{k,l}$ through the corresponding inverse Fourier transform, $$A_{k,l} = \frac{\beta_0}{(2\pi)^2} \int_{-\infty}^{+\infty} \int_{-\infty}^{+\infty} B(\omega, v) \exp\begin{bmatrix} -j\omega(k-k_0) - \\ jv(l-l_0) \end{bmatrix} dv d\omega \quad (2.14)$$

$$= \frac{\beta_0}{\pi^2} \int_0^{+\infty} \int_0^{+\infty} B(\omega, v) \cos[\omega(k-k_0)]\cos[v(l-l_0)] dv d\omega,$$

$$k = 1, 2, \ldots, M, l = 1, 2, \ldots, N,$$

$$k_0 = \frac{1}{2}(M+1), l_0 = \frac{1}{2}(N+1),$$

which are real. In Equation (2.14), $\beta_0$ is a normalization constant due to discrete summation in Equation (2.7b). It is easy to see that solution (2.14) is indeed symmetric, i.e., solution (2.14) implies relation (2.10). The constant solution for spatial correlation (2.8) can also be obtained using the Fourier transform approach.

IV. Operational Methodology

Figure 2:
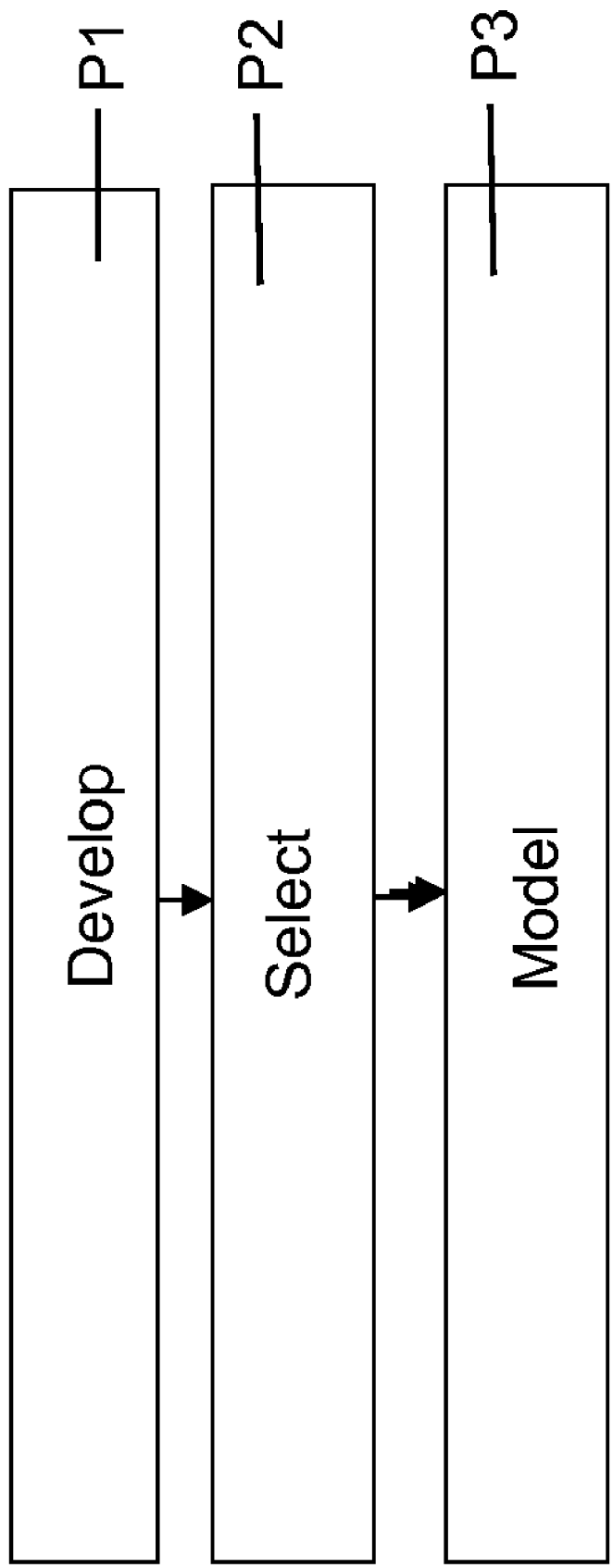
FIG. 2 shows a flow diagram of an operational method of spatial correlation modeling system of FIG. 1.

Referring to FIG. 2, in process P1, developer 130 develops a solution for each of a plurality of specific forms of spatial correlations of a characteristic of a circuit design, and develops a plurality of solution methods for a given spatial correlation. Developer 130 also provides the remainder of the spatial correlations. Developer 130 may include a user of system 100. The solutions can be any of the above-described solutions. In any event, the developing includes changing a set of unrealistic correlation coefficients to a set of realistic correlation coefficients.

For example, developer 130 may divide a two-dimensional chip region into a sub-region grid of I rows and J columns, and define a two-dimensional spatial correlation C(i, j; k, l) on the sub-region grid such that each grid point (i, j) or (k, l) represents one sub-region. Developer 130 may then treat two instances of the characteristic within a common sub-region as perfectly correlated, and treat two instances of the characteristic in different sub-regions as either partially correlated or completely un-correlated.

Figure 7A:
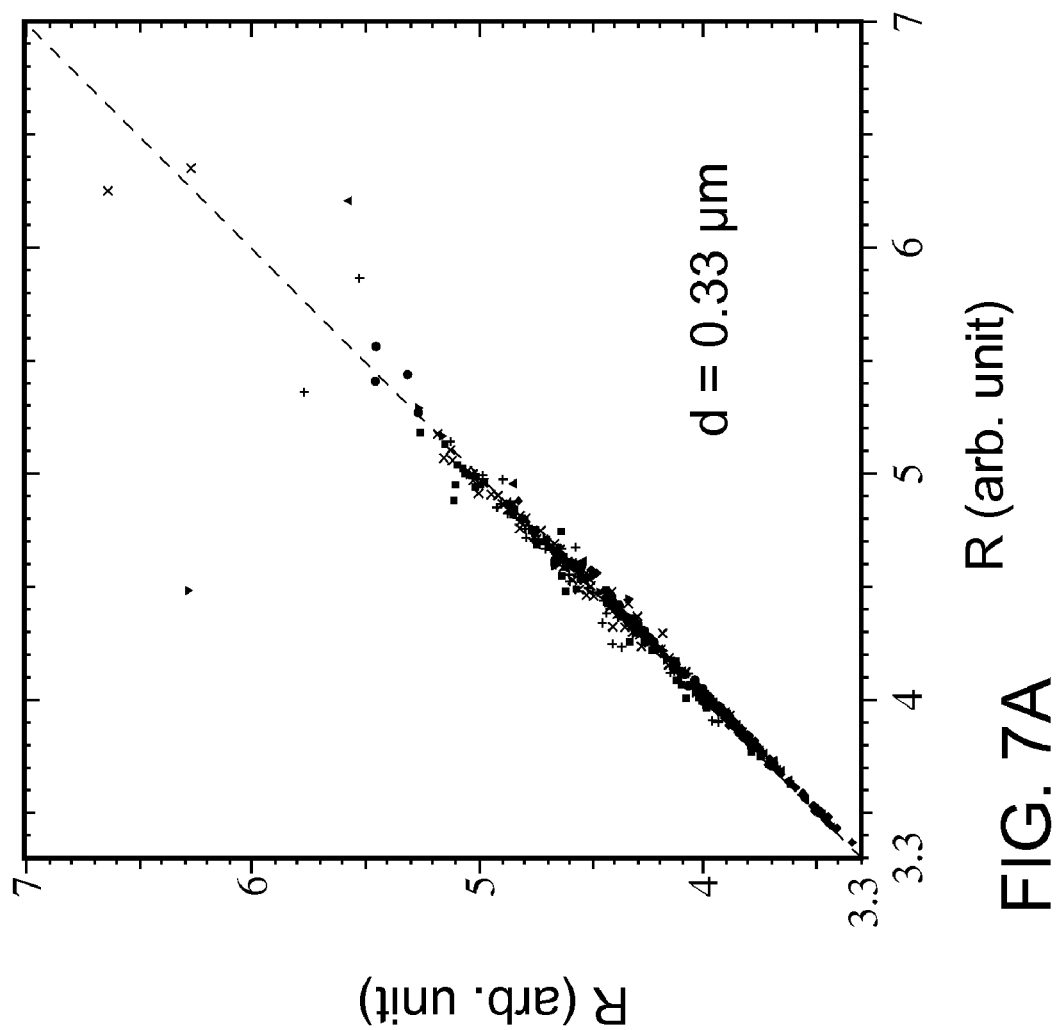
FIG. 7 shows scatter plots illustrating a spatial correlation between measured interconnect resistance (R) of same wire width and same wire-to-wire space but distance d apart.
Figure 7B:
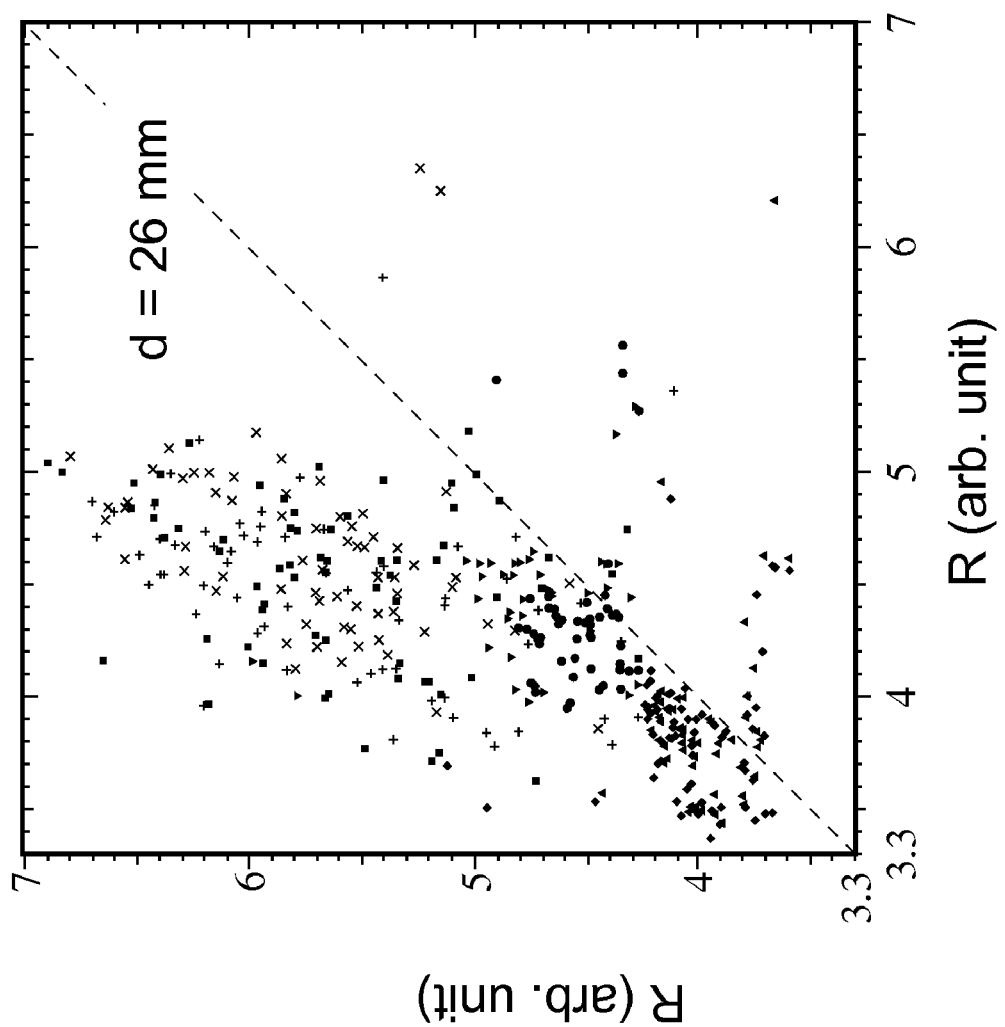
Figure 8:
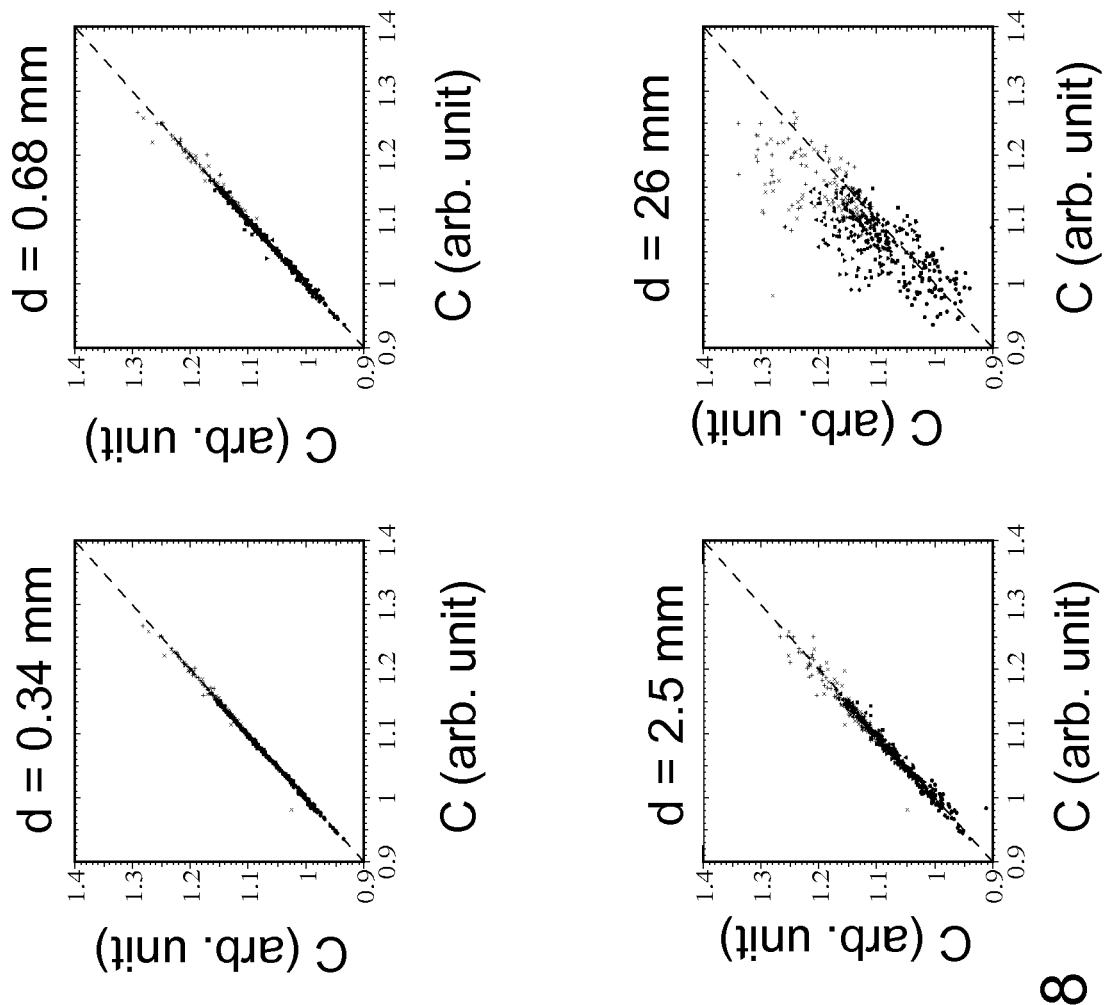
FIG. 8 shows scatter plots illustrating a spatial correlation between measured interconnect capacitance (C) of same wire width and same wire-to-wire space (but distance d apart).

In process P2, selector 132 selects one of the solutions that is closest to a desired spatial correlation. For example, FIG. 4 and FIGS. 9A-14B show many examples of spatial correlations, and corresponding solution $a_k$ are known, either analytically or numerically. If a desired spatial correlation curve is between two plotted spatial correlation curves in any of FIGS. 11A-14B, one can vary the power p value to better match the desired spatial correlation. In one embodiment, the desired spatial correlation is based on hardware testing data. For example, FIG. 7 shows scatter plots illustrating a spatial correlation between measured interconnect resistance (R) of same wire width and same wire-to-wire space (but distance d apart) from a 45 nm technology. The larger distance d case has a smaller correlation coefficient. FIG. 8 shows more scatter plots illustrating the correlation between measured interconnect capacitance (C) of same wire width and same wire-to-wire space (but distance d apart) from a 45 nm technology. These measured hardware data shows that a correlation coefficient decreases with increasing distance d. The correlation coefficient is close to one at a very small distance d, and decreases to zero with increasing distance d. Selector 132 also automatically changes a set of unrealistic correlation coefficients to a set of realistic correlation coefficients.

In process P3, modeler 134 models the desired spatial correlation using the selected solution, and incorporates it into a device model, a circuit model, a circuit simulation, and/or a circuit design. Modeler 134 may include any now known or later developed modeling system such as device's compact models, device's SPICE models, and/or circuit simulators. In one embodiment, the modeling includes modeling the desired spatial correlation as a translational invariant having a correlation range of (M-1) rows in a row direction and of (N-1) columns in a column direction such that:

$$C(i,j;i\pm m,j\pm n)=F(M,m;N,n),$$

$$F(M,0;N,0)=1, F(M,M;N,n)=F(M,m;N,N)=0,$$

$$m=0,1,2,\ldots,M, n=0,1,2,\ldots,N;$$

and for all others, C(i, j; k, l)=0, and a solution therefor uses (I+M−1)(J+N−1) independent stochastic variables to represent IJ correlated characteristic variables:

$$x_{ij} = x_0 + \sigma \sum_{k=1}^{M} \sum_{l=1}^{N} A_{kl} g_{i+k-1,j+l-1},$$

$$i = 1, 2, \ldots, I, j = 1, 2, \ldots, J,$$

where $x_{ij}$ is an instance of the characteristic in sub-region (i, j), $x_0$ is a mean value of the characteristic, $\sigma$ is a standard deviation of the characteristic, each $g_{ij}$ is an independent stochastic, random variable of mean zero and standard deviation one, and MN coefficients $A_{kl}$ satisfy a total of MN conditions:

$$F(M, m; N, n) = \sum_{k=1}^{M-m} \sum_{l=1}^{N-n} A_{k,l} A_{k+m,l+n},$$

$$m = 0, 1, 2, \ldots, M-1, n = 0, 1, 2, \ldots, N-1.$$

In this case, as described above, the two-dimensional spatial correlation may be represented as a product of two one-dimensional spatial correlations:

$$F(M,m;N,n)=f_1(M,m)f_2(N,n), m=0,1,2,\ldots,M, n=0,1,2,\ldots,N,$$

where the one-dimensional spatial correlations have relations:

$$f_1(M,0)=1, f_1(M,M)=0,$$

$$f_2(N,0)=1, f_2(N,N)=0, \text{ and}$$

a two-dimensional solution is given by a product of two one-dimensional solutions:

$$A_{kl}=a_k b_l, k=1,2,\ldots,M, l=1,2,\ldots,N,$$

where M coefficients $a_k$ satisfy M relations:

$$\sum_{k=1}^{M-m} a_k a_{k+m} = f_1(M, m), m = 0, 1, 2, \ldots, M-1, \text{ and}$$

N coefficients $b_l$ satisfy N relations:

$$\sum_{l=1}^{N-n} b_l b_{l+n} = f_2(N, n), n = 0, 1, 2, \ldots, N-1.$$

One of the plurality of one-dimensional spatial correlations includes a linear-decay spatial correlation:

$$f_1(M, m) = 1 - \frac{m}{M}, \quad m = 0, 1, 2, \ldots, M,$$

which has a solution:

$$a_k = \frac{1}{\sqrt{M}}, \quad k = 1, 2, \ldots, M.$$

Where the above-described one-dimensional correlations are used, the developing (process P1) may include developing a plurality of one-dimensional correlations by starting from an expression for $a_k$ and finding corresponding spatial correlation $f_1(M, m)$, and starting from an expression for $b_l$ and finding corresponding spatial correlation $f_2(N, n)$. Alternatively, the developing (process P1) may include developing a solution $a_k$ for a given one-dimensional spatial correlation first using a Fourier transform, then using a max( ) operation, thirdly using a square root operation, then using an inverse Fourier transform, and lastly a possible normalization.

V. Conclusion

As discussed herein, various systems and components are described as "obtaining" data (e.g., circuit design 90, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for model a circuit design 90 including the modeling of spatial correlations, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to model a circuit design 90 including the modeling of spatial correlations. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 112, magnetic tape, a removable computer diskette, a random access memory (RAM), a read-only memory (ROM), a tape, a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for model a circuit design 90 including the modeling of spatial correlations. In this case, a computer infrastructure, such as computer infrastructure 102 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provide, could offer to model a circuit design 90 including the modeling of spatial correlations as described herein. In this case, the service provider can manage (e.g., create, maintain, support, etc.) a computer infrastructure, such as computer infrastructure 102 (FIG. 1), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   performing using a computer:
   developing a solution for each of a plurality of specific forms of spatial correlations of a characteristic of a circuit design and developing a plurality of solution methods for a given spatial correlation, wherein the developing includes:
   dividing a two-dimensional chip region into a sub-region grid of I rows and J columns,
   defining a two-dimensional spatial correlation C(i, j; k, l) on the sub-region grid such that each grid point (i, j) or (k, l) represents one sub-region, and
   treating two instances of the characteristic within a common sub-region as perfectly correlated, and treating two instances of the characteristic in different sub-regions as either partially correlated or completely un-correlated;
   selecting one of the solutions that is closest to a desired spatial correlation; and
   modeling the desired spatial correlation using the selected solution.

2. The method of claim 1, wherein the modeling includes modeling the desired spatial correlation as a translational invariant having a correlation range of (M−1) rows in a row direction and of (N−1) columns in a column direction such that:

$$C(i,j;i\pm m,j\pm n)=F(M,m;N,n),$$

$$F(M,0;N,0)=1, F(M,M;N,n)=F(M,m;N,N)=0,$$

m=0,1,2,...,M, n=0,1,2,...,N;

and for all others, C(i, j; k, l)=0, and
a solution therefore uses (I+M−1)(J+N−1) independent stochastic variables to represent IJ correlated characteristic variables:

$$x_{ij} = x_0 + \sigma \sum_{k=1}^{M}\sum_{l=1}^{N} A_{kl} g_{i+k-1, j+l-1},$$

$$i = 1, 2, \ldots, I, \quad j = 1, 2, \ldots, J,$$

where $x_{ij}$ is an instance of the characteristic in sub-region (i, j), $x_0$ is a mean value of the characteristic, σ is a standard deviation of the characteristic, each $g_{ij}$ is an independent stochastic, random variable of mean zero and standard deviation one, and MN coefficients $A_{kl}$ satisfy a total of MN conditions:

$$F(M, m; N, n) = \sum_{k=1}^{M-m}\sum_{l=1}^{N-n} A_{k,l} A_{k+m, l+n},$$

$$m = 0, 1, 2, \ldots, M-1, \quad n = 0, 1, 2, \ldots, N-1.$$

3. The method of claim 1, wherein the two-dimensional spatial correlation is represented as a product of two one-dimensional spatial correlations:

$$F(M,m;N,n)=f_1(M,m)f_2(N,n), m=0,1,2,\ldots,M, n=0,1,2,\ldots,N,$$

where the one-dimensional spatial correlations have relations:

$$f_1(M,0)=1, f_1(M,M)=0,$$

$$f_2(N,0)=1, f_2(N,N)=0, \text{ and}$$

a two-dimensional solution is given by a product of two one-dimensional solutions:

$$A_{kl}=a_k b_l, k=1,2,\ldots,M, l=1,2,\ldots,N,$$

where M coefficients $a_k$ satisfy M relations:

$$\sum_{k=1}^{M-m} a_k a_{k+m} = f_1(M, m), \quad m = 0, 1, 2, \ldots, M-1, \text{ and}$$

N coefficients $b_l$ satisfy N relations:

$$\sum_{l=1}^{N-n} b_l b_{l+n} = f_2(N, n), \quad n = 0, 1, 2, \ldots, N-1.$$

4. The method of claim 3, wherein one of the plurality of one-dimensional spatial correlations includes a linear-decay spatial correlation:

$$f_1(M, m) = 1 - \frac{m}{M}, \quad m = 0, 1, 2, \ldots, M,$$

which has a solution:

$$a_k = \frac{1}{\sqrt{M}}, \quad k = 1, 2, \ldots, M.$$

5. The method of claim 3, wherein one of the plurality of one-dimensional spatial correlations includes a spatial correlation of Gaussian distribution:

$$f(M, m) = \exp\left(-\frac{\eta^2 m^2}{4M^2}\right), \quad m = 1, 2, \ldots, M-1,$$

which has a solution of being also a truncated Gaussian distribution but with a smaller (x $1/\sqrt{2}$) standard deviation:

$$a_k = \beta \exp\left[-\frac{\eta^2(k-k_0)^2}{2M^2}\right], \quad k=1,2,\ldots,M, \quad k_0 = \frac{1}{2}(M+1),$$

where $\beta$ is a normalization constant.

6. The method of claim 3, wherein one of the plurality of one-dimensional spatial correlations includes a spatial correlation of Lorentzian distribution:

$$f(M,m) = \frac{1}{1+(\eta m/M)^2}, \quad m=1,2,\ldots,M-1,$$

which has a solution of being also a truncated Lorentzian distribution but with a 50% smaller half width at half height:

$$a_k = \frac{\beta}{1+[2\eta(k-k_0)/M]^2}, \quad k=1,2,\ldots,M, \quad k_0 = \frac{1}{2}(M+1),$$

where $\beta$ is a normalization constant.

7. The method of claim 3, wherein the developing includes developing a plurality of one-dimensional correlations by starting from an expression for $a_k$ and finding corresponding spatial correlation $f_1(M, m)$, and starting from an expression for $b_l$ and finding corresponding spatial correlation $f_2(N, n)$.

8. The method of claim 3, wherein the developing includes developing a solution for a given one-dimensional spatial correlation $f(M, m)$ using two Fourier transforms along with a max( ) operation and a square root operation:

$$a_k = \beta_1 \int_0^{+\infty} \alpha(\omega)\cos[\omega(k-k_0)]d\omega,$$

$$k=1,2,\ldots,M, \quad k_0 = \frac{1}{2}(M+1),$$

where $\beta1$ is a normalization constant, $\alpha(\omega) = \pm\sqrt{\max(\phi(\omega),0)}$, $\phi(\omega)$ is a Fourier transform of the one-dimensional spatial correlation $f(M, m)$, $$\phi(\omega) = 2\int_0^M f(M,m)\cos(\omega m)dm,$$

and m in the spatial correlation $f(M, m)$ has been extended to a real value, and includes developing a solution for a given two-dimensional spatial correlation $F(M, m; N, n)$ using the Fourier transforms along with a max( ) operation and a square root operation:

$$A_{k,l} = \beta_2 \int_0^{+\infty}\int_0^{+\infty} B(\omega,v)\cos[\omega(k-k_0)]\cos[v(l-l_0)]dvd\omega,$$

$$k=1,2,\ldots,M, \quad l=1,2,\ldots,N, \quad k_0 = \frac{1}{2}(M+1),$$

$$l_0 = \frac{1}{2}(N+1),$$

where $\beta_2$ is a normalization constant, $B(\omega,v) = \pm\sqrt{\max(\Phi(\omega,v),0)}$, $\Phi(\omega, v)$ is a Fourier transform of the two-dimensional spatial correlation $F(M, m; N, n)$, $$\Phi(\omega,v) = 4\int_0^M \int_0^N F(M,m;N,n)\cos(\omega m)\cos(vn)dndn,$$

and m and n in the spatial correlation $F(M, m; N, n)$ have been extended to be real.

9. The method of claim 1, wherein the desired spatial correlation is based on hardware measurement data.

10. The method of claim 1, wherein the developing includes changing a set of unrealistic correlation coefficients to a set of realistic correlation coefficients.

11. A system comprising:

means for developing a solution for each of a plurality of specific forms of spatial correlations of a characteristic of a circuit design and a plurality of solution methods for a given spatial correlation, wherein the developing means:

divides a two-dimensional chip region into a sub-region grid of I rows and J columns, defines a two-dimensional spatial correlation C(i, j; k, l) on the sub-region grid such that each grid point (i, j) or (k, l) represents one sub-region, and treats two instances of the characteristic within a common sub-region as perfectly correlated, and treats two instances of the characteristic in different sub-regions as either partially correlated or completely un-correlated;

means for selecting one of the solutions that is closest to a desired spatial correlation; and means for modeling the desired spatial correlation using the selected solution.

12. The system of claim 11, wherein the modeling means models the desired spatial correlation as a translational invariant having a correlation range of (M−1) rows in a row direction and of (N−1) columns in a column direction such that:

$C(i,j;i\pm m,j\pm n)=F(M,m;N,n)$, $F(M,0;N,0)=1, F(M,M;N,n)=F(M,m;N,N)=0$, m=0,1,2,...,M, n=0,1,2,...,N;

and for all others, C(i, j; k, l)=0, and a solution therefor uses (I+M−1)(J+N−1) independent stochastic variables to represent IJ correlated characteristic variables:

$$x_{ij} = x_0 + \sigma \sum_{k=1}^M \sum_{l=1}^N A_{kl} g_{i+k-1, j+l-1},$$

$$i=1,2,\ldots,I, \quad j=1,2,\ldots,J,$$

where $x_{ij}$ is an instance of the characteristic in sub-region (i, j), $x_0$ is a mean value of the characteristic, $\sigma$ is a standard deviation of the characteristic, each $g_{ij}$ is an independent stochastic, random variable of mean zero and standard deviation one, and MN coefficients $A_{kl}$ satisfy a total of MN conditions:

$$F(M, m; N, n) = \sum_{k=1}^{M-m}\sum_{l=1}^{N-n} A_{k,l} A_{k+m,l+n},$$

$$m = 0, 1, 2, \ldots, M-1, \quad n = 0, 1, 2, \ldots, N-1.$$

13. The system of claim 11, wherein the two-dimensional spatial correlation is represented as a product of two one-dimensional spatial correlations:

$$F(M,m;N,n)=f_1(M,m)f_2(N,n), m=0,1,2,\ldots,M, n=0,1,2,\ldots,N,$$

where the one-dimensional spatial correlations have relations:

$$f_1(M,0)=1, f_1(M,M)=0,$$

$$f_2(N,0)=1, f_2(N,N)=0, \text{ and}$$

a two-dimensional solution is given by a product of two one-dimensional solutions:

$$A_{k,l}=a_k b_l, k=1,2,\ldots,M, l=1,2,\ldots,N,$$

where M coefficients $a_k$ satisfy M relations:

$$\sum_{k=1}^{M-m} a_k a_{k+m} = f_1(M, m), \quad m = 0, 1, 2, \ldots, M-1, \text{ and}$$

N coefficients $b_l$ satisfy N relations:

$$\sum_{l=1}^{N-n} b_l b_{l+n} = f_2(N, n), \quad n = 0, 1, 2, \ldots, N-1.$$

14. The system of claim 11, wherein one of the plurality of one-dimensional spatial correlations includes a linear-decay spatial correlation:

$$f_1(M, m) = 1 - \frac{m}{M}, \quad m = 0, 1, 2, \ldots, M,$$

which has a solution:

$$a_k = \frac{1}{\sqrt{M}}, \quad k = 1, 2, \ldots, M.$$

15. The system of claim 11, wherein one of the plurality of one-dimensional spatial correlations includes a spatial correlation of Gaussian distribution:

$$f(M, m) = \exp\left(-\frac{\eta^2 m^2}{4M^2}\right), \quad m = 1, 2, \ldots, M-1,$$

which has a solution of being also a truncated Gaussian distribution but with a smaller ($\times 1/\sqrt{2}$) standard deviation:

$$a_k = \beta\exp\left[-\frac{\eta^2(k-k_0)^2}{2M^2}\right], \quad k = 1, 2, \ldots, M, \quad k_0 = \frac{1}{2}(M+1),$$

where $\beta$ is a normalization constant.

16. The system of claim 11, wherein one of the plurality of one-dimensional spatial correlations includes a spatial correlation of Lorentzian distribution:

$$f(M, m) = \frac{1}{1 + (\eta m/M)^2}, \quad m = 1, 2, \ldots, M-1,$$

which has a solution of being also a truncated Lorentzian distribution but with a 50% smaller half width at half height:

$$a_k = \frac{\beta}{1 + [2\eta(k-k_0)/M]^2}, \quad k = 1, 2, \ldots, M, \quad k_0 = \frac{1}{2}(M+1),$$

where $\beta$ is a normalization constant.

17. The system of claim 11, wherein the developing includes developing a solution for a given one-dimensional spatial correlation f(M, m) using two Fourier transforms along with a max( ) operation and a square root operation, $$a_k = \beta_1 \int_0^{+\infty} \alpha(\omega)\cos[\omega(k-k_0)]d\omega,$$

$$k = 1, 2, \ldots, M, \quad k_0 = \frac{1}{2}(M+1),$$

where $\beta_1$ is a normalization constant, $$\alpha(\omega) = \pm\sqrt{\max(\phi(\omega),0)},$$

$\phi(\omega)$ is a Fourier transform of the one-dimensional spatial correlation f(M, m), $$\phi(\omega) = 2\int_0^M f(M, m)\cos(\omega m)dm, \quad \omega \geq 0,$$

and m in the spatial correlation f(M, m) has been extended to a real value, and includes developing a solution for a given two-dimensional spatial correlation F(M, m; N, n) using the Fourier transforms along with a max( ) operation and a square root operation, $$A_{k,l} = \beta_2 \int_0^{+\infty}\int_0^{+\infty} B(\omega, v)\cos[\omega(k-k_0)]\cos[v(l-l_0)]dvd\omega,$$

$$k = 1, 2, \ldots, M, \quad l = 1, 2, \ldots, N, \quad k_0 = \frac{1}{2}(M+1),$$

$$l_0 = \frac{1}{2}(N+1),$$

where $\beta_2$ is a normalization constant, $B(\omega, v) = \pm\sqrt{\max(\Phi(\omega,v),0)}$, $\Phi(\omega, v)$ is a Fourier transform of the two-dimensional spatial correlation F(M, m; N, n), $$\Phi(\omega, v) = 4 \int_0^M \int_0^N F(M, m; N, n)\cos(\omega m)\cos(vn) dn dm,$$

and m and n in the spatial correlation F(M, m; N, n) have been extended to be real.

18. A program product stored on a computer-readable, non-transitory medium, which when executed by a computer, models spatial correlations, the program product comprising:

program code for developing a solution for each of a plurality of specific forms of spatial correlations of a characteristic of a circuit design and for developing a plurality of solution methods for a given spatial correlation, wherein the developing program code:

divides a two-dimensional chip region into a sub-region grid of I rows and J columns, defines a two-dimensional spatial correlation C(i, j; k, l) on the sub-region grid such that each grid point (i, j) or (k, l) represents one sub-region, and treats two instances of the characteristic within a common sub-region as perfectly correlated, and treats two instances of the characteristic in different sub-regions as either partially correlated or completely un-correlated;

program code for selecting one of the solutions that is closest to a desired spatial correlation; and program code for modeling the desired spatial correlation using the selected solution.

\* \* \* \* \*